(12) United States Patent
Ema

(10) Patent No.: US 7,696,555 B2
(45) Date of Patent: Apr. 13, 2010

(54) SEMICONDUCTOR DEVICE AND ITS MANUFACTURE METHOD

(75) Inventor: Taiji Ema, Kawasaki (JP)

(73) Assignee: Fujitsu Microelectronics Ltd., Yokohama (JP)

( * ) Notice: Subject to any disclaimer, the term of this patent is extended or adjusted under 35 U.S.C. 154(b) by 3 days.

(21) Appl. No.: 11/302,198

(22) Filed: Dec. 14, 2005

(65) Prior Publication Data
US 2006/0091447 A1  May 4, 2006

(51) Int. Cl.
*H01L 29/76* (2006.01)
(52) U.S. Cl. .................. 257/314; 257/315; 257/316; 438/257
(58) Field of Classification Search ......... 257/314–316, 257/324, E29.14, E29.257, E29.319, E29.161; 438/257
See application file for complete search history.

(56) References Cited

U.S. PATENT DOCUMENTS

| 6,080,624 A * | 6/2000 | Kamiya et al. ............ 438/257 |
| 6,593,654 B2 | 7/2003 | Oyamatsu |

FOREIGN PATENT DOCUMENTS

| JP | 7-74326 | 3/1995 |
| JP | 9-321046 | 12/1997 |
| JP | 10-200075 | 7/1998 |
| JP | 10-223858 | 8/1998 |
| JP | 11-017156 | 1/1999 |
| JP | 11-274154 A | 10/1999 |
| JP | 11-307742 | 11/1999 |
| JP | 2000-40806 | 2/2000 |
| JP | 2000-77407 | 3/2000 |
| JP | 2001-111013 | 4/2001 |
| JP | 2001-203286 | 7/2001 |
| JP | 2001-244353 | 9/2001 |
| JP | 2003-100866 | 4/2003 |

OTHER PUBLICATIONS

"Japanese Office Action", Partial English-language translation, mailed Sept 1, 2009 from JP Patent Office for corresponding JP App. No. 2005-508760.

* cited by examiner

*Primary Examiner*—Theresa T Doan
(74) *Attorney, Agent, or Firm*—Fujitsu Patent Center

(57) ABSTRACT

A semiconductor device includes: a first insulating layer with a flat surface formed over a semiconductor substrate structure in which a plurality of semiconductor elements are formed; column-like conductive plugs formed to penetrate the first insulating layer in the thickness direction; elongated wall-like conductive plugs formed through the first insulating layer in the thickness direction; a second insulating layer with a flat surface formed on the first insulating layer covering the column-like conductive plugs and the wall-like conductive plugs; and first wirings having dual damascene structures. Each of the first wirings has a first portion penetrating the second insulating layer in the thickness direction and connected to at least one of the columnar conductive plugs, and a second portion formed in the second insulating layer to an intermediate depth and apparently intersects at least one of the wall-like conductive plugs when viewed above.

12 Claims, 22 Drawing Sheets

SEMICONDUCTOR DEVICE AND ITS MANUFACTURE METHOD

CROSS REFERENCE TO RELATED APPLICATION

This application is based on and claims priority of PCT/JP2003/011125 filed on Aug. 29, 2003, the entire contents of which are incorporated herein by reference.

BACKGROUND OF THE INVENTION

A) Field of the Invention

The present invention relates to a semiconductor device and its manufacture method, and more particularly to a semiconductor device having crossing cubic wirings and its manufacture method.

B) Description of the Related Art

As an integration degree of semiconductor devices is improved, wirings are becoming finer. An integration degree of lower layer wirings near a semiconductor substrate is particularly high and there is high demands for miniaturization. Even if wirings are made fine, it is desired to lower parasitic resistance and parasitic capacitance. Various proposals have been made for lowering parasitic resistance and capacitance.

A conductive plug is formed by forming an insulating film on an underlying layer having a conductive layer, forming a contact hole for the conductive layer, embedding polysilicon or tungsten in the contact hole by chemical vapor deposition and removing an unnecessary portion by etch-back or chemical mechanical polishing (CMP).

After the connection region is led upward by the conductive plug, a damascene wiring is used often. The damascene wiring is formed by forming an insulating film, forming an interlayer connection via hole and a wiring trench in the insulating film, embedding a conductive layer in the via hole and wiring trench and removing an unnecessary portion by CMP or etch-back. For example, after the via hole and wiring trench are formed, a barrier layer of TiN, TaN or the like and a copper layer are formed by sputtering, and a copper layer is formed by electroplating. This method is suitable for forming a wiring having a high precision by using copper with a low resistivity.

There are high demands for improving an integration degree of a semiconductor device having a repetitive pattern such as memories. Various proposals have been made for improving wiring patterns. It is necessary to form in addition to a control gate, a ground source wiring and a read drain wiring (bit line) for a flash memory. Crossed wirings are therefore necessary.

JP-A-2001-244353 proposes to form a wall-like conductive plug extending along a word line direction for a source diffusion layer of a flash memory element, and form an isolated column-like conductive plug for the drain diffusion layer.

FIGS. 11A, 11B, 11C and 11D show a typical wiring structure disclosed in JP-A-2002-244353. FIG. 11A is a plan view. FIGS. 11B, 11C and 11D are cross sectional views taken along lines III-III, IV-IV and V-V, respectively.

Referring to FIG. 11A, a first source line SL1 is a wall-like conductive plug connected to a source diffusion layer of a memory device, disposed vertically in FIG. 11A and being parallel to a word line. A drain contact plug DCP is an isolated column-like conductive plug formed on each drain diffusion layer of the memory device. A drain line DL is a drain wiring disposed horizontally in FIG. 11A and connected to the drain contact plug DCP. An insulating layer is involved between the drain line DL and first source line SL1. A second source line SL2 and the drain line DL are alternately disposed horizontally.

As shown in FIG. 11B, the drain contact plug DCP is a column-like plug made of a first drain contact plug DCP1 buried in a first interlayer insulating film IL1 and a second drain contact plug DCP2 buried in a second interlayer insulating film IL2 and stacked on the first drain contact plug DCP1. The drain line DL is formed by growing a conductive film of Al or the like on the second interlayer insulating film IL2 and pattering the film.

Stacked on a semiconductor substrate 130 are a tunnel insulating film 132, a floating gate 133, an insulating film 134, a word line (control gate) WL and a protective oxide film 136, and on this lamination structure, a silicon nitride film 137 and the first interlayer insulation film IL1 are formed. In the following, the first interlayer insulating film IL1 and silicon nitride film 137 are collectively called the first interlayer insulating film IL1.

As shown in FIGS. 11B and 11C, the first source line SL1 is buried in the first interlayer insulating film IL1 and extends parallel to the word line WL. A ground line resistance is lowered by forming the wall-like conductive plug having the same height as that of the first interlayer insulating film IL1.

As shown in FIG. 11D, the second source line SL2 has the structure similar to the drain line DL and extends parallel to the drain line. A source contact plug SCP is formed in the second interlayer insulating film at the position where the first source line SL1 and second source line SL2 cross, to electrically connect the first and second source lines.

The first drain contact plug DCP1 and first source line SL1 are formed in a self-alignment manner relative to the word line WL to improve an integration degree. However, as shown in FIG. 11D, the second drain contact plug cannot be formed under the second source line SL2 so that the memory elements under the second source line SL2 are dummy. This publication does not teach mixture of a memory circuit and a peripheral circuit.

Similar structures to the structure of the above-described conductive plug are also disclosed in JP-A-HEI-7-74326, JP-2001-111013 and JP-A-2001-203286.

Patent Document 1
   JP-A-2001-244353

Patent Document 2
   JP-A-HEI-7-74326

Patent Document 3
   JP-A-2001-111013

Patent Document 4
   JP-A-2001-203286

If a memory circuit and a peripheral logic circuit are mixedly mounted, wirings of the memory circuit are required to have a low parasitic capacitance, and wirings of the peripheral logic circuit are required to have a low parasitic resistance. These requirements are hard to be met by using the same wiring structure. In order to meet these requirements, it is effective that thin wirings are formed in the memory circuit and thick wirings are formed in the peripheral circuit.

Thin wirings in the memory circuit and thick wirings in the peripheral logic circuit can be formed by etching and lowering a lower interlayer insulating film in the peripheral circuit, forming an etch stopper layer and an upper interlayer insulating film and forming damascene wirings.

Patent Document 5
   JP-A-HEI-10-223858

Patent Document 6
    JP-A-HEI-10-200075
    Thick and thin wirings can also be formed by performing wiring trench forming etching twice by using different masks to form deep and shallow trenches, and embedding wirings in the trenches.

Patent Document 7
    JP-A-HEI-11-307742

Patent Document 8
    JP-A-HEI-9-321046

Patent Document 9
    JP-A-2000-77407

SUMMARY OF THE INVENTION

An object of the present invention is to provide a semiconductor device of high performance having crossed wirings suitable for miniaturization.

Another object of the present invention is to provide a semiconductor device having wirings of different thicknesses in the same layer.

Still another object of the present invention is to provide a semiconductor device having a flash memory with a low ground line resistance and a low bit wiring capacitance.

Another object of the present invention is to provide methods of manufacturing these semiconductor devices.

According to one aspect of the present invention, there is provided a semiconductor device comprising: a semiconductor substrate structure having a plurality of semiconductor elements formed therein; a first insulating layer having a flat surface and formed above the semiconductor substrate structure; a plurality of column-like conductive plugs formed through a full thickness of the first insulating layer; a plurality of wall-like conductive plugs formed through the full thickness of the first insulating layer; a second insulating layer having a flat surface formed on the first insulating layer, covering the column-like conductive plugs and wall-like conductive plugs; and a plurality of first wirings of a dual damascene structure, the first wirings including a first portion formed through a full thickness of the second insulating layer and connected to at least one of the column-like conductive plugs and a second portion formed in the second insulating layer to an intermediate depth and crossing at least one of the wall-like conductive plugs in a separated state.

In a preferred embodiment, the semiconductor substrate structure includes a flash memory unit which comprises: a semiconductor substrate; a plurality of striped active regions disposed in rows and columns in the semiconductor substrate; a plurality of word lines formed above the semiconductor substrate and disposed crossing the active regions; a plurality of floating gates each disposed in a cross area between the active regions and the word lines and at an intermediate position between the active regions and the word lines; and a plurality of diffusion regions formed in the active regions between the word lines.

According to another aspect of the present invention, there is provided a semiconductor device manufacture method comprising steps of: (a) preparing a semiconductor substrate structure having a plurality of semiconductor elements formed therein; (b) forming a first insulating layer having a flat surface above the semiconductor substrate structure; (c) forming a plurality of first wiring trenches and a plurality of first connection holes through a full thickness of the first insulating layer; (d) depositing a first conductive layer burying the first wiring trenches and the first connection holes; (e) removing an unnecessary portion of the first conductive layer on the first insulating layer by chemical mechanical polishing, and forming a plurality of wall-like conductive plugs and a plurality of column-like conductive plugs through a full thickness of the first insulating layer; (f) forming a second insulating layer having a flat surface on the first insulating layer, the second insulating layer covering the column-like conductive plugs and the wall-like conductive plugs; (g) forming a plurality of recess portions in the second insulating layer, the recess portions include a plurality of second connection holes formed through a full thickness of the second insulating layer and exposing surfaces of the column-like conductive plugs and a second wiring trench contiguous with at least one of the second connection holes, the second wiring trench reaching an intermediate depth of the second insulating layer and crossing at least one of the wall-like conductive plugs in a separated state; (h) forming a second conductive layer burying the second connection holes and the second wiring trenches; and (i) removing an unnecessary portion of the second conductivity layer on the second insulating layer by chemical mechanical polishing, and forming a plurality of first wirings of a dual damascene structure connected to at least one of the column-like conductive plugs and crossing at least one of the wall-like conductive plugs in a separated state.

DESCRIPTION OF THE PREFERRED EMBODIMENTS

Embodiments of the present invention will be described with reference to the accompanying drawings.

Figure 1A:
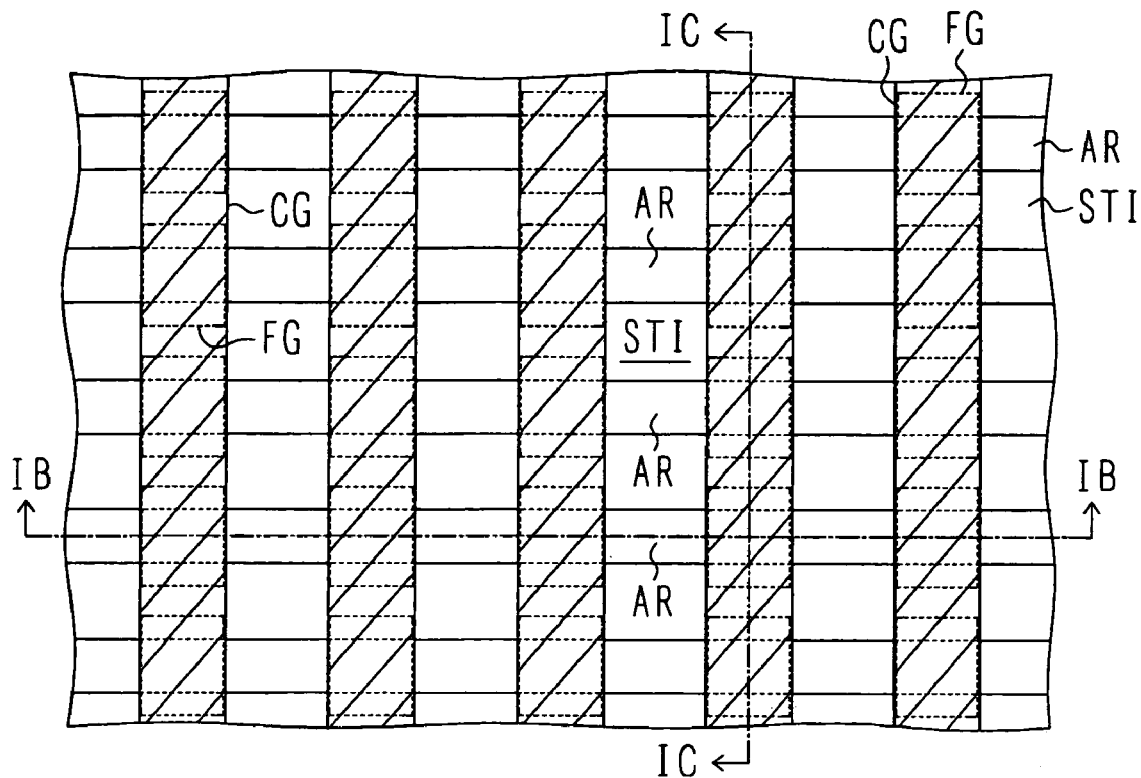
FIGS. 1A, 1B and 1C are a plan view and cross sectional views showing a lower layer structure of a semiconductor device according to a first embodiment of the present invention.

FIGS. 1A to 3H are plan views and cross sectional views showing the structure of the semiconductor device according to the first embodiment of the present invention. FIGS. 1A, 1B and 1C show a lower layer structure in which transistors constituting flash memory cells are formed on a semiconductor substrate. FIGS. 2A to 2D show a middle layer structure in which a first interlayer insulating film is formed on the lower layer structure and plugs are buried in the first interlayer insulating film. FIGS. 3A to 3H show a semiconductor device having wirings formed on the middle layer structure.

As shown in FIG. 1A, an element isolation region STI is formed in a semiconductor substrate by shallow trench isolation to define a plurality of striped active regions AR. A gate structure (word line structure) including a floating gate FG and a control gate CG is formed crossing the active regions AR.

Figure 1B:
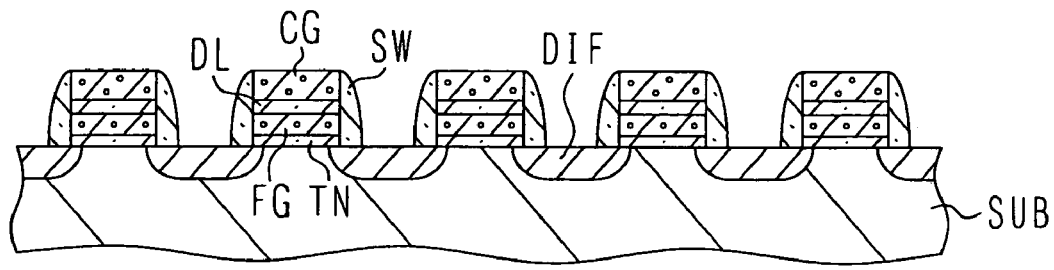

FIG. 1B is a cross sectional view of an active regions taken along line IB-IB shown in FIG. 1A. A gate structure of a flash memory is formed by laminating on a semiconductor substrate SUB a tunnel oxide film TN, a polysilicon floating gate FG, a dielectric layer DL and a polysilicon control gate CG. Side wall spacers SW of silicon nitride are formed on side walls of the gate structure. In the active region between the gate structures, a diffusion region DIF is formed. Namely, in the active regions, flash memory cells are connected in series.

Figure 1C:
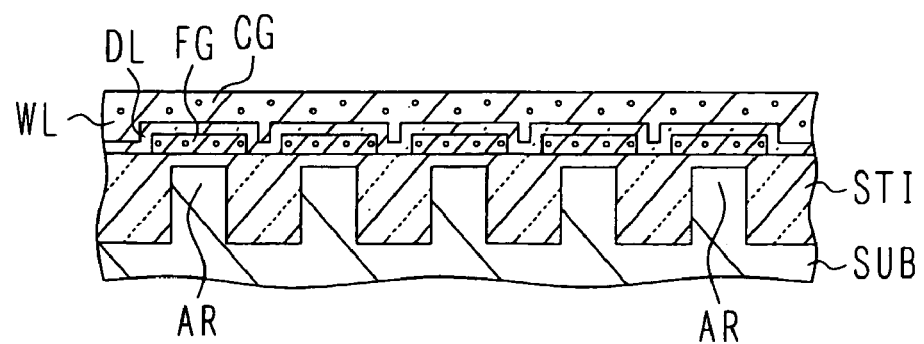

FIG. 1C is a cross sectional view of the gate structure taken along line IC-IC of FIG. 1A. An element isolation region STI and active region AR are alternately disposed in the surface layer of the semiconductor substrate SUB. The floating gate FG is disposed above the active region AR in correspondence to each active region AR. The dielectric layer DL and control gate CG are formed covering the floating gate FG. As shown in FIG. 1A, the gate structure is patterned vertically in a striped shape to form a word line WL structure.

A first interlayer insulating film is formed on the structure shown in FIGS. 1A, 1B and 1C, holes and trenches for plugs are formed through the first interlayer insulating film, and W is buried in the holes and trenches to form plug structures.

Figure 2A:
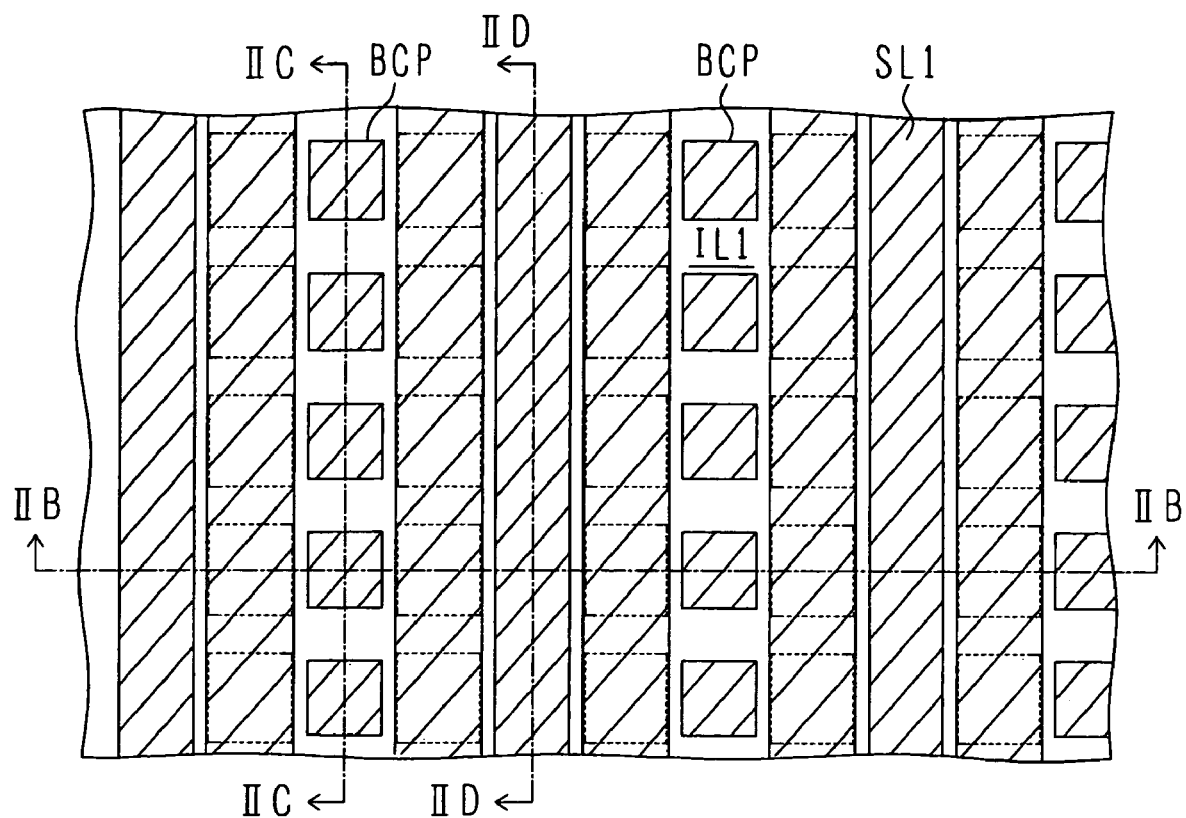
FIGS. 2A to 2D are a plan view and cross sectional views showing a middle layer structure of the semiconductor device according to the first embodiment of the present invention.

As shown in FIG. 2A, after a first interlayer insulating film IL1 is deposited on the substrate whole surface, plug holes and plug trenches are etched, W is deposited by CVD, and an unnecessary portion is removed by chemical mechanical polishing (CMP). In this manner, bit contact plugs BCP and first source lines SL1 of wall-like plugs are buried in the first interlayer insulating film IL1.

Figure 2B:
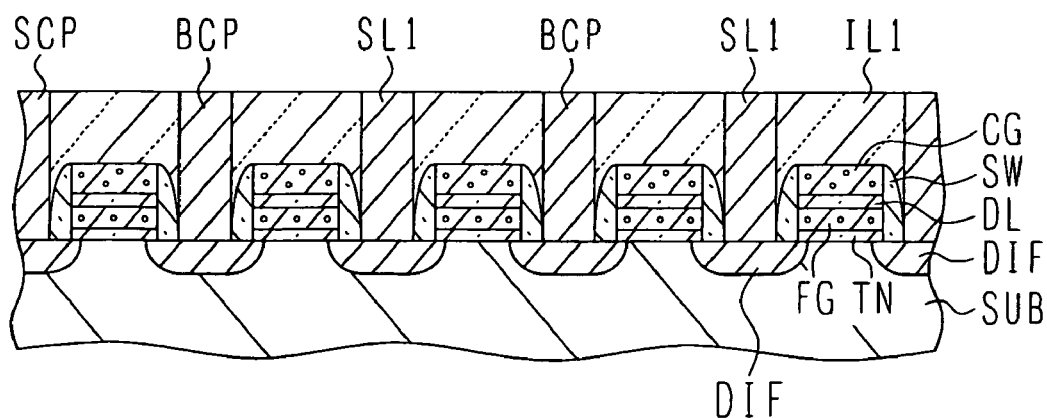

FIG. 2B is a cross sectional view taken along line IIB-IIB of FIG. 2A and crossing bit contact plugs BCP and first source lines SL1. The bit contact plug BCP and first source line SL1 are alternately disposed being connected to the diffusion regions DIF between gate structures.

Figure 2C:
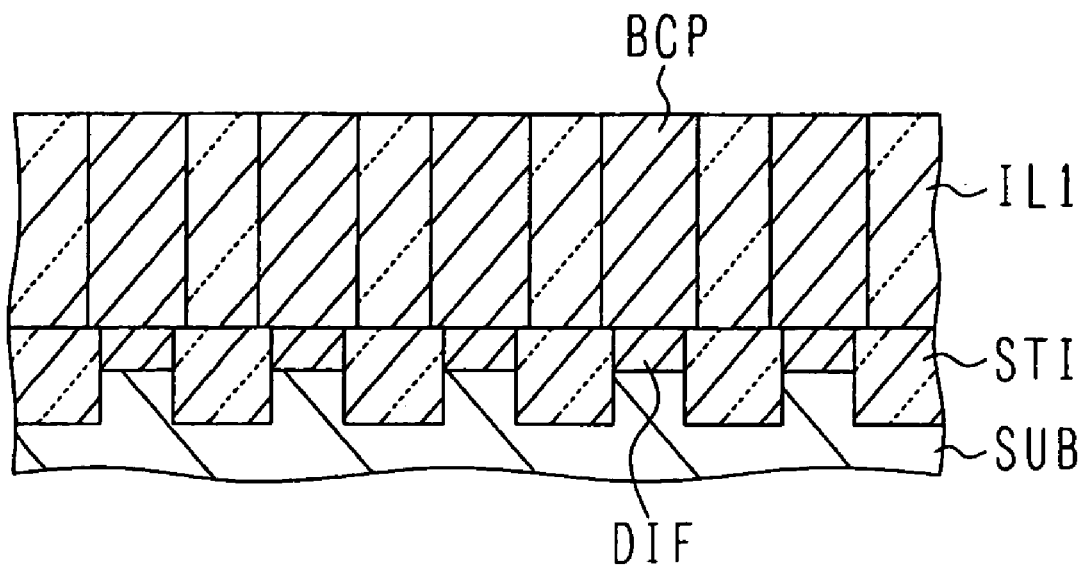

FIG. 2C is a cross sectional view taken along line IIC-IIC of FIG. 2A and crossing an array of bit contact plugs BCP. The diffusion region DIF is formed in the active region defined by the element isolation region STI, and the bit contact plug BCP is formed above the diffusion region.

Figure 2D:
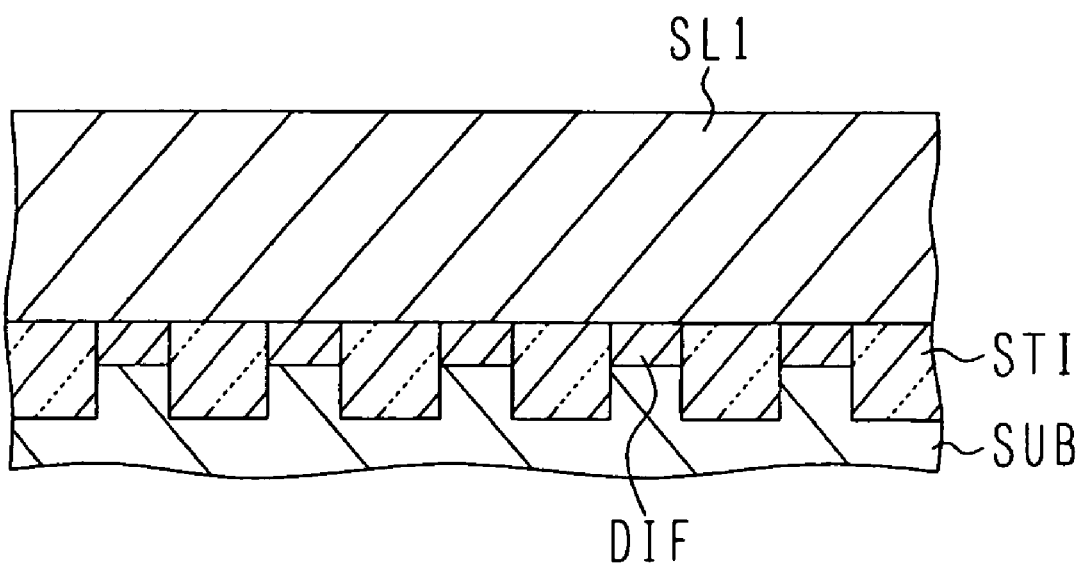

FIG. 2D is a cross sectional view taken along line IID-IID of FIG. 2A. The first source line SL1 is formed through the full thickness of the first interlayer insulating film IL1 and has a wall-like shape.

After the column-like bit conduct plug BCP and the first source line SL1 of the wall-like plug structure are formed, a second interlayer insulating film is formed. Wirings are formed to an intermediate thickness and wirings are formed through the full thickness. The wiring formed to an intermediate thickness is provided with a portion selectively formed through the full thickness to be connected to the lower conductive layer.

FIGS. 3A to 3G are a plan view and cross sectional views of the semiconductor device with wirings.

Figure 3A:
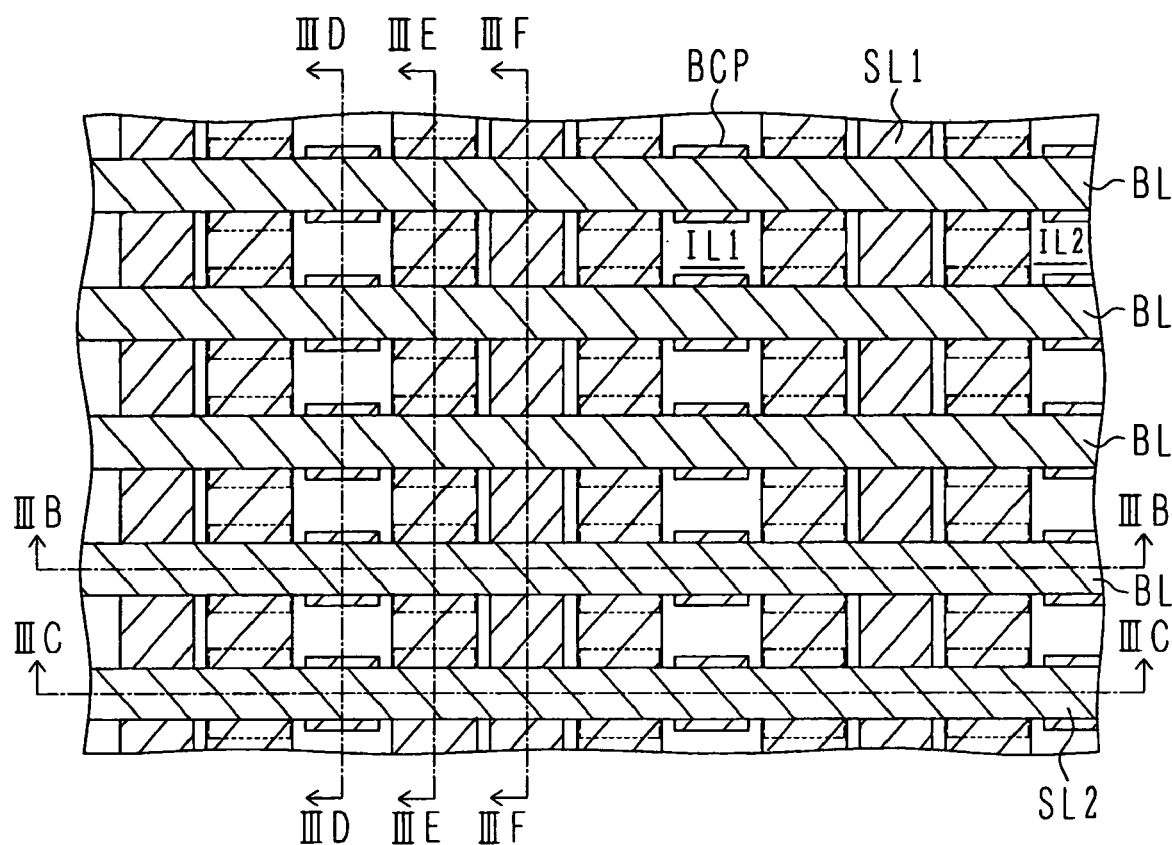
FIGS. 3A to 3H are a plan view and cross sectional views showing the semiconductor device according to the first embodiment of the present invention.

As shown in FIG. 3A, the second interlayer insulating film IL2 is formed covering the plug structure, lateral trenches are formed and the bit line BL and second source line SL2 are buried in the trenches.

Figure 3B:
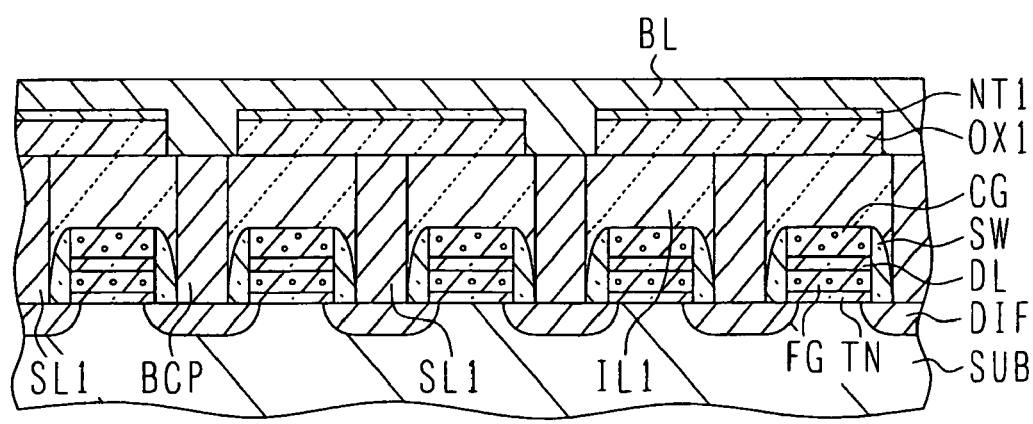
Figure 3C:
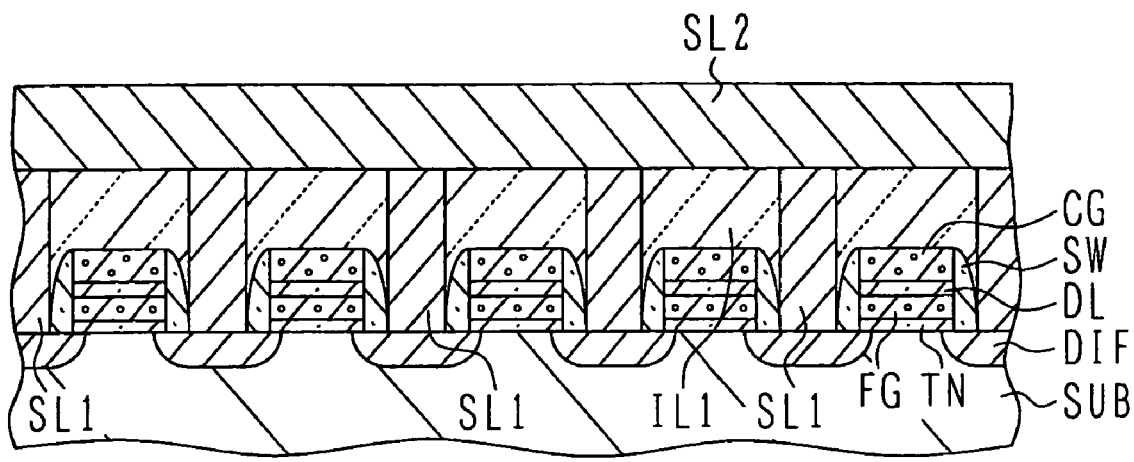
Figure 3D:
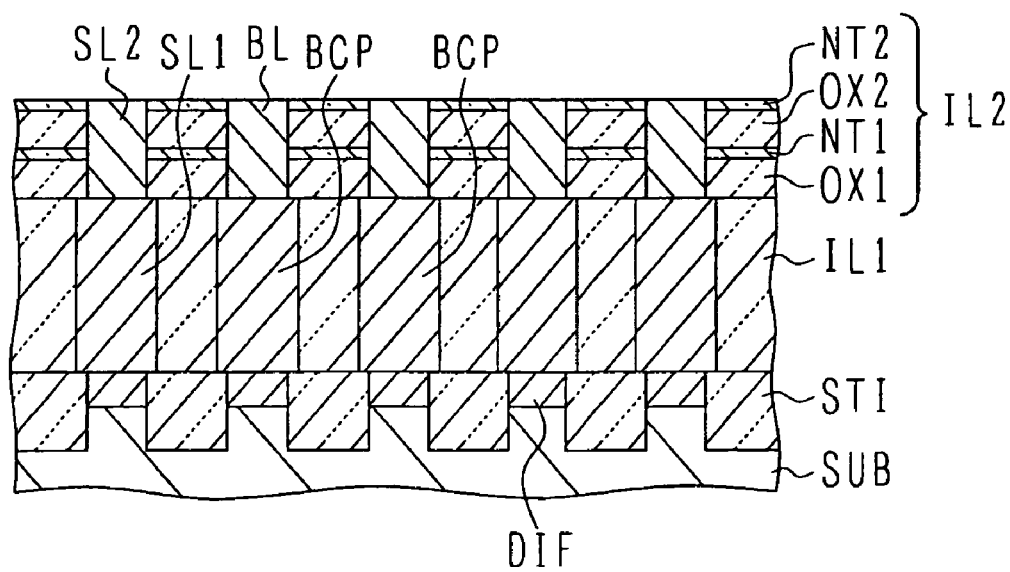

As shown in FIG. 3D, the second interlayer insulating film IL2 is made of a lamination of a first silicon oxide layer OX1, a first silicon nitride layer NI1, a second silicon oxide layer OX2 and a second silicon nitride layer NT2.

FIGS. 3B and 3C are cross sectional views of the bit line and source line taken along lines IIIB-IIIB and IIIC-IIIC of FIG. 3A.

As shown in FIG. 3B, the bit line BL is a thin wiring formed from the surface of the second interlayer insulating film down to the surface of the first silicon nitride layer NT1, and in the region on the bit contact plug BCP, is formed through the full thickness of the second interlayer insulating film to be electrically connected to the bit contact plug BCP. The thin bit line BL crosses the first source line SL1 via the insulating layer.

As shown in FIG. 3C, the second source line SL2 is a thick wiring formed through the full thickness of the second interlayer insulating film. The second source line SL2 is connected in common to a plurality of first source lines SL1. The first source line of low resistance is connected to the thick second source line SL2 of low resistance, so that the whole source ground line has low resistance.

Figure 3E:
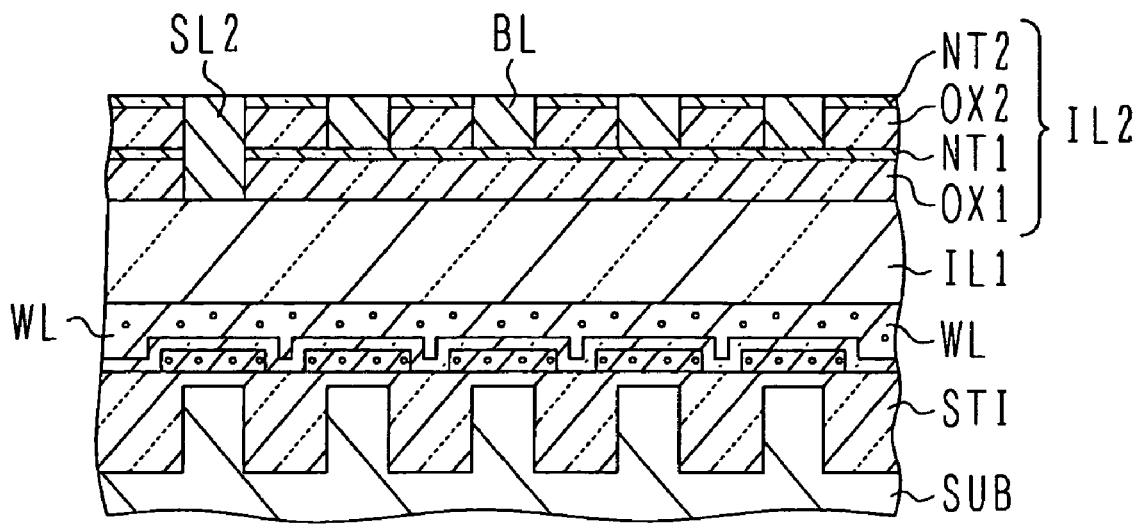
Figure 3F:
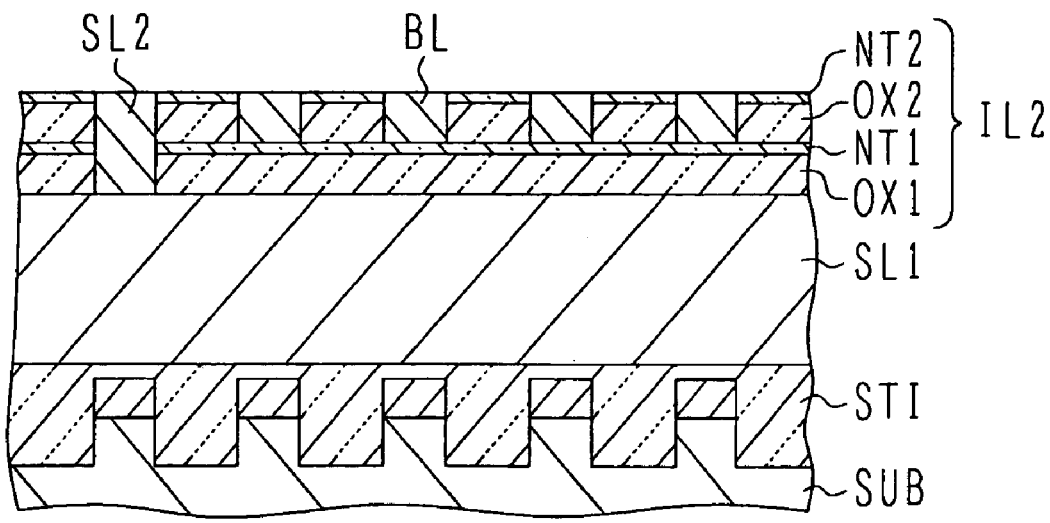
Figure 3G:
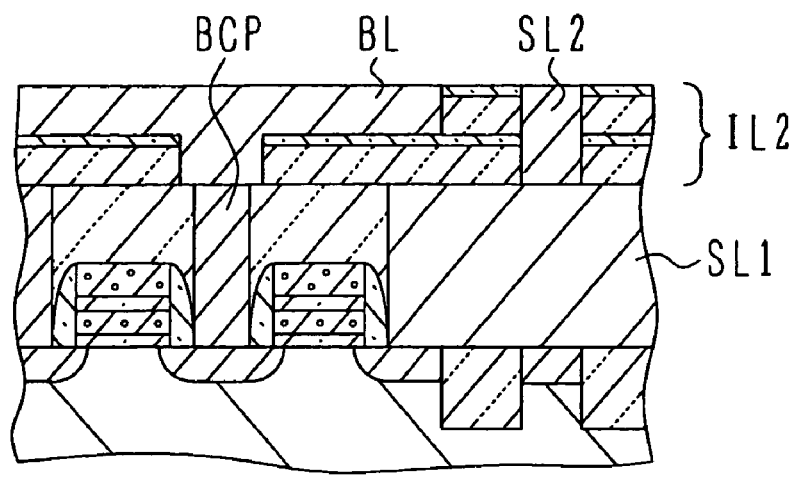

FIGS. 3D, 3E and 3F are cross sectional views taken along lines IIID-IIID, IIIE-IIIE, and IIIF-IIIF of FIG. 3A. FIG. 3G is a cross sectional view taken along line deflected from line IIIB to line IIIF.

As shown in FIG. 3D, above the bit contact plug BCP, the bit line BL is formed through the full thickness of the second interlayer insulating film IL2, having a thickness equal to that of the second source line SL2, and connected to the bit contact plug BCP. In the region between wirings, the full thickness of the second interlayer insulating film IL2 is left being constituted of the first silicon oxide layer OX1, the first silicon nitride layer NT1, a second silicon oxide layer OX2 and a second silicon nitride layer NT2.

As shown in FIG. 3E, above the gate structure, the first interlayer insulating film IL1 is formed on the gate electrode to be insulated from the second source line SL2. The bit line BL is formed above the first silicon oxide film OX1 and first silicon nitride layer NT1 in the second interlayer insulating film IL2. Since the bit line BL is formed thin, parasitic capacitance can be lowered.

As shown in FIG. 3F, although the first source line SL1 is formed through the full thickness of the first interlayer insulating film, the first silicon oxide layer OX1 and first silicon nitride layer NT1 are formed under the bit line BL so that insulation can be maintained. The second source line SL2 is formed through the full thickness of the second interlayer insulating film to be electrically connected to the surface of the first source line SL1.

FIG. 3G shows the wiring structure along a direction of the bit line BL and along a direction of the source line SL. The bit line BL is formed in an upper surface layer of the second interlayer insulating film IL2, and formed through the full thickness of the second interlayer insulating film IL2 above the bit contact plug BCP to be electrically connected to the bit contact plug BCP. In the intermediate region, the bit line BL is formed thinner so that it can cross the first source line SL1.

The second source line SL2 is formed through the full thickness of the second interlayer insulating film IL2, and in the area where the first source line SL1 is formed, electrically connected to the first source line SL1. Since the second source line SL2 is formed thicker, its resistance is low.

Figure 3H:
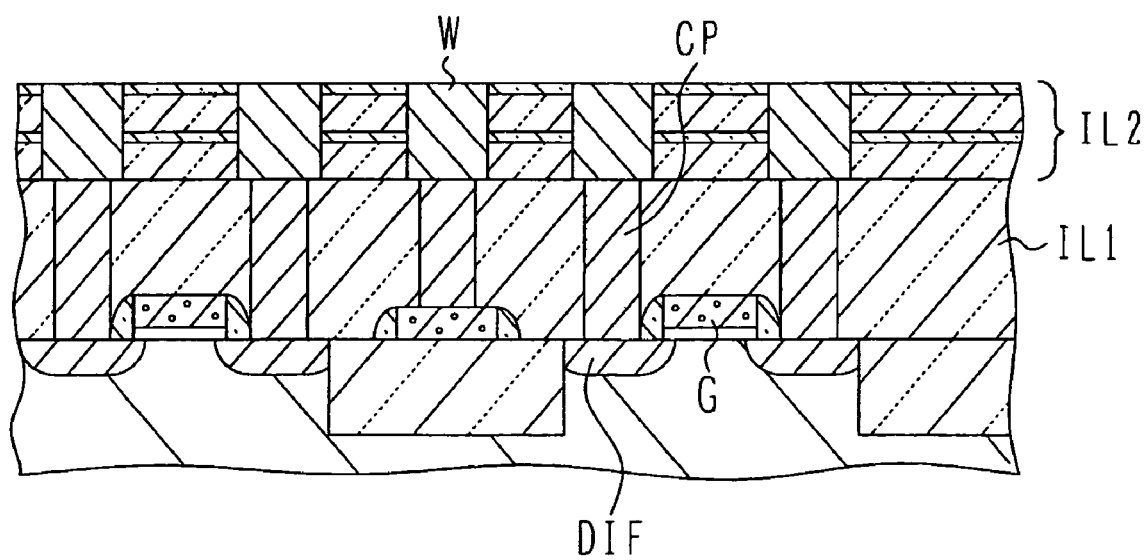

FIG. 3H shows the structure of the peripheral circuit area. In the peripheral circuit area, a gate electrode G is formed by using the same layer as that of the control gate. Diffusion regions DIF constituting source/drain regions are formed in active regions on both sides of the gate electrode. A contact plug CP is formed thorough the first interlayer insulating film IL1, and the second interlayer insulating film IL2 is formed on the contact plug CP. A wiring W is formed through the full thickness of the second interlayer insulating film IL2. Since the wiring W is formed thicker, its resistance is low. By lowering the wiring, high speed operation of the peripheral circuit can be enhanced.

Figure 4X:
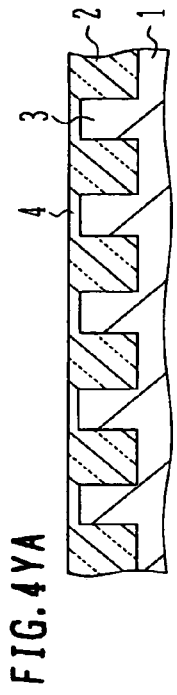
FIGS. 4XA to 4XJ and FIGS. 4YA to 4YJ are cross sectional views illustrating a manufacture method for the semiconductor device according to the first embodiment of the present invention.
Figure 4X:
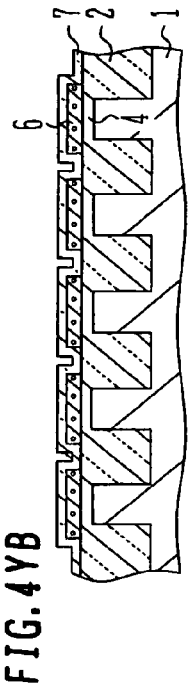
Figure 4X:
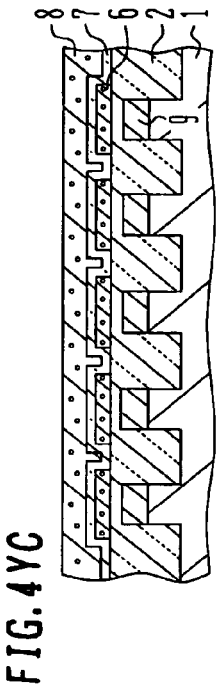
Figure 4X:
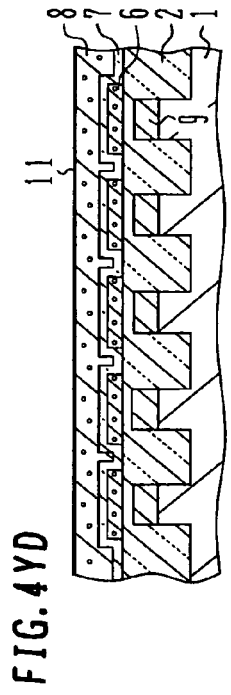
Figure 4X:
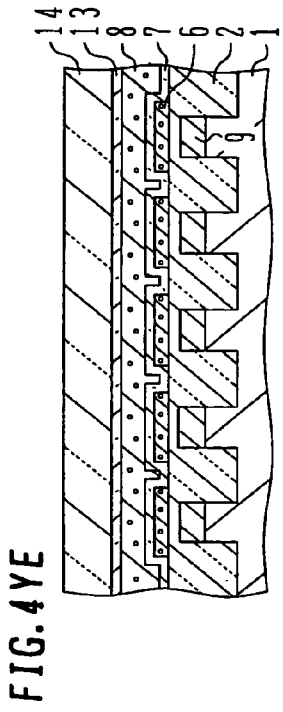
Figure 4Y:
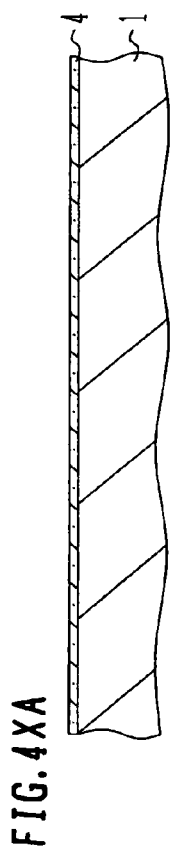
Figure 4Y:
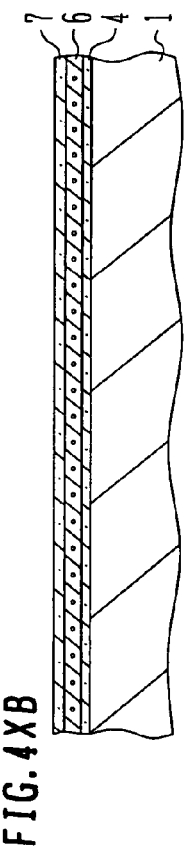
Figure 4Y:
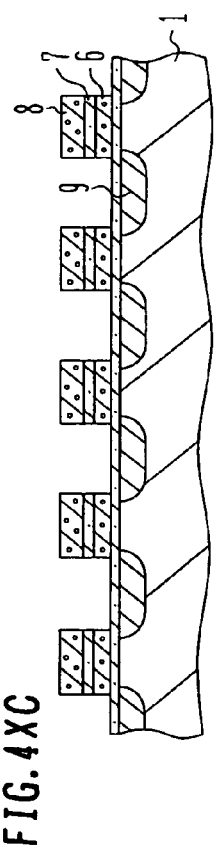
Figure 4Y:
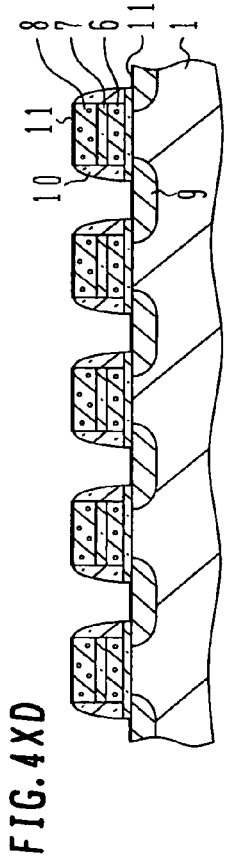
Figure 4Y:
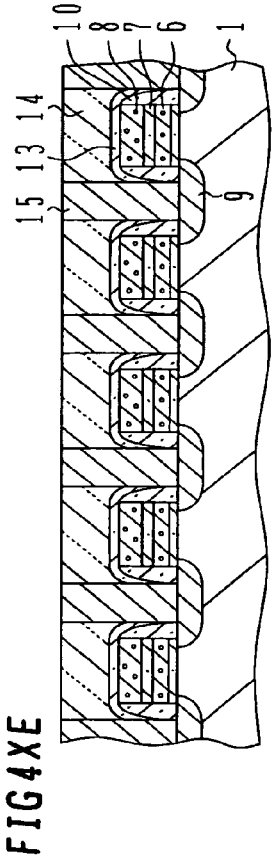
Figure 4X:
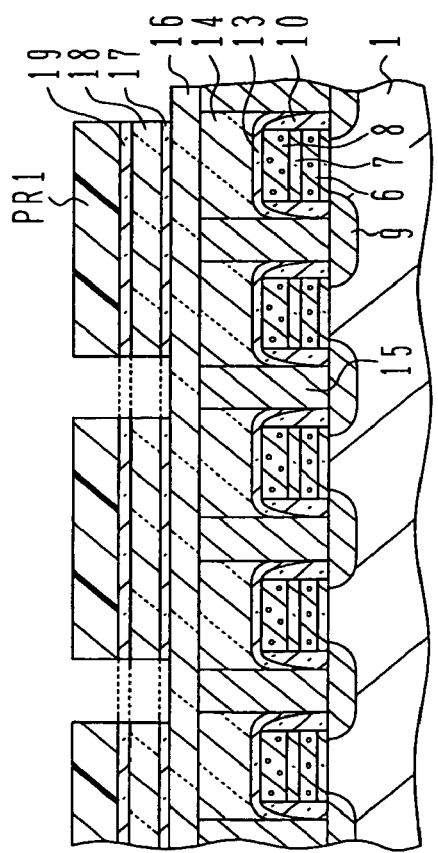
Figure 4X:
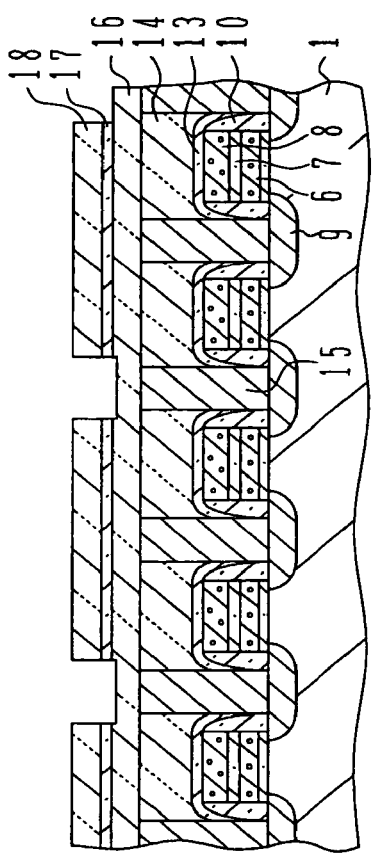
Figure 4Y:
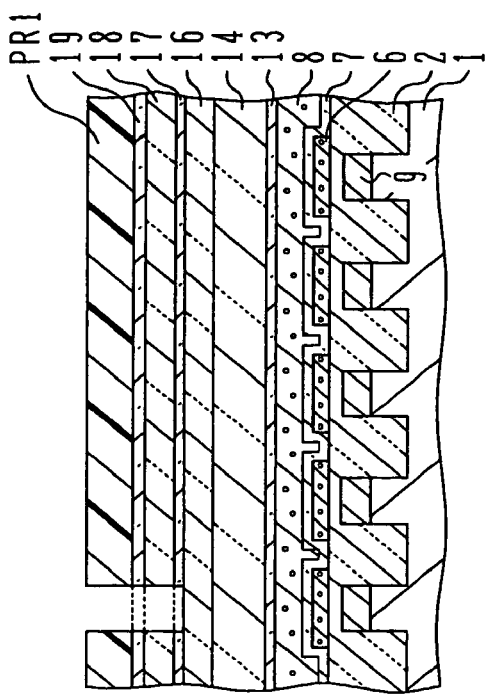
Figure 4Y:
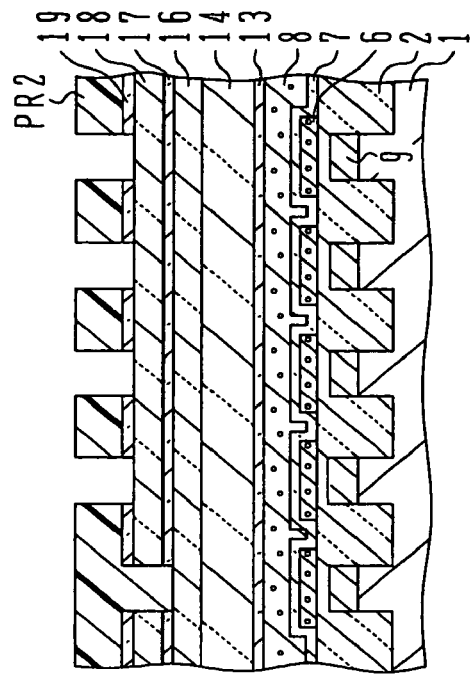
Figure 4Y:
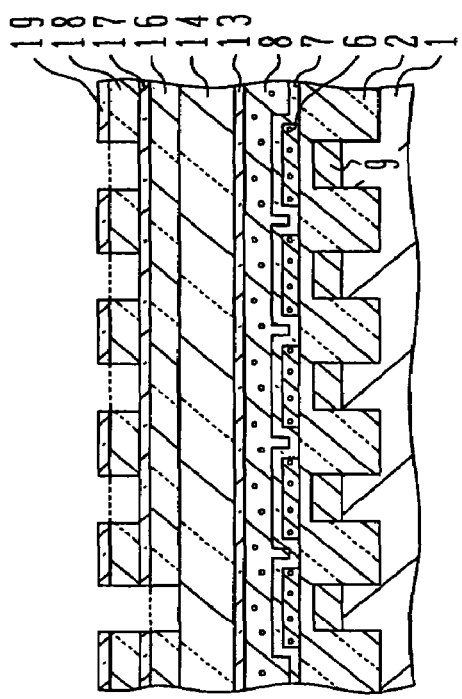
Figure 4Y:
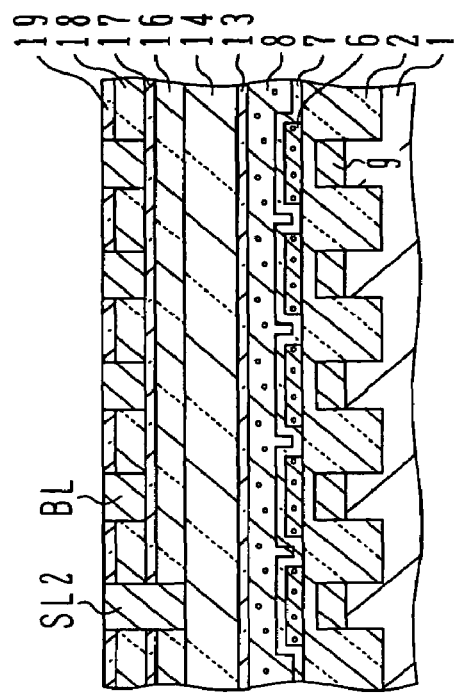
Figure 4X:
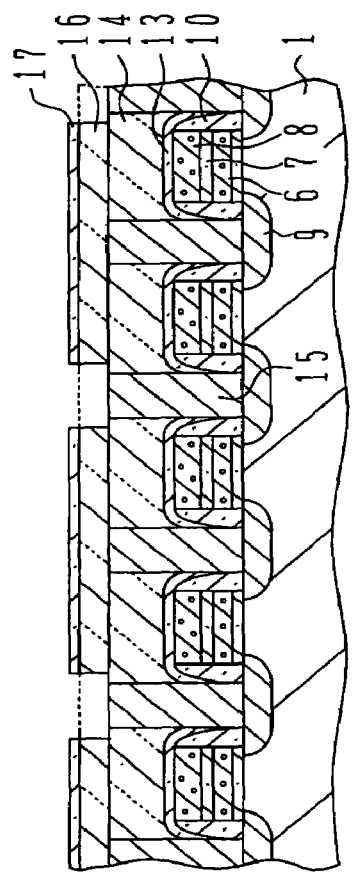
Figure 4X:
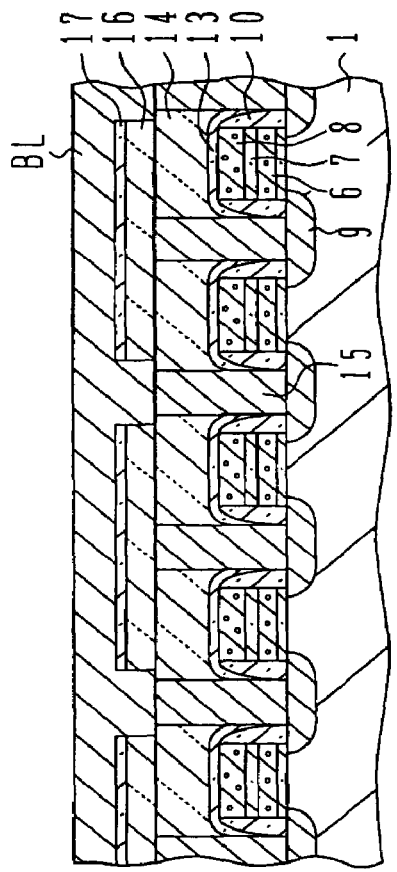
Figure 4Y:
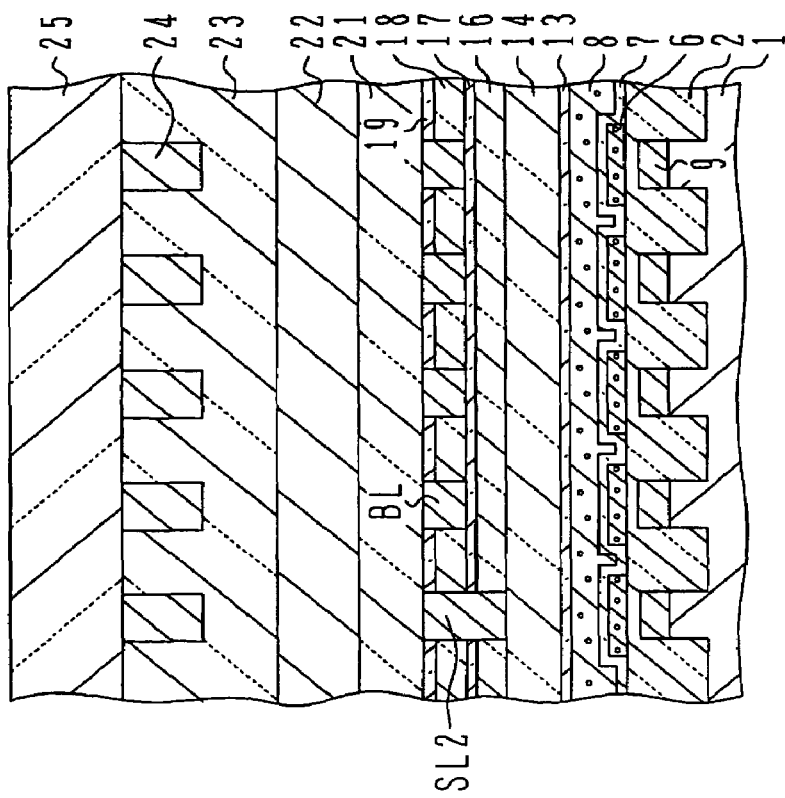
Figure 4X:
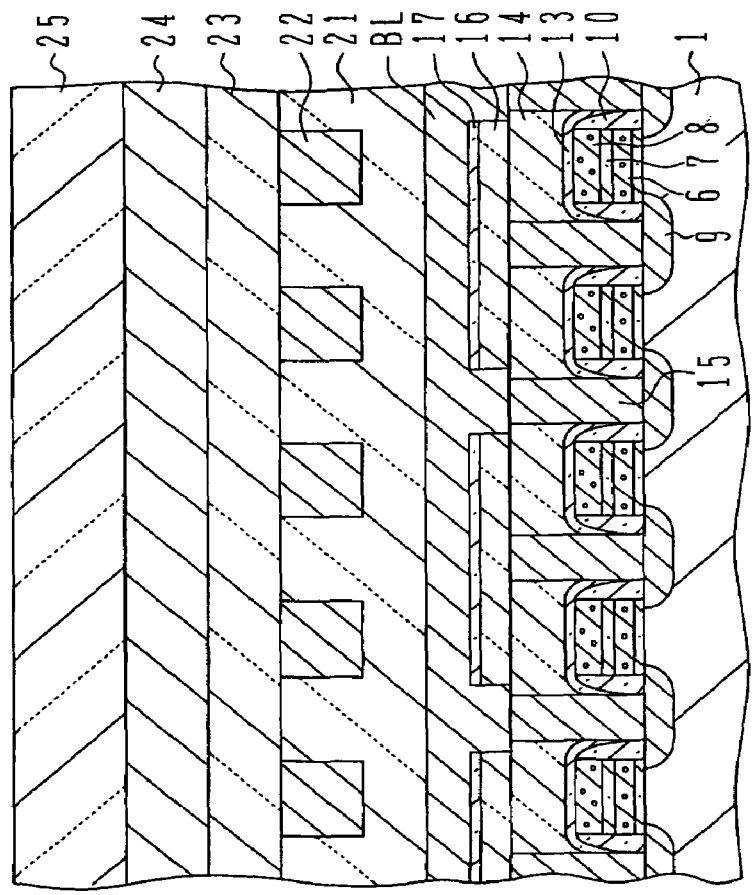

FIGS. 4XA to 4XJ and FIGS. 4YA to 4YJ are cross sectional views illustrating main processes for manufacturing the semiconductor device of the first embodiment. Cross sectional views on the left side are taken along a bit line direction, and cross sectional views on the right side are taken along a word line (gate structure).

As shown in FIGS. 4XA and 4YA, an element isolation trench is formed in a surface layer of a silicon substrate 1, silicon oxide is buried in the trench to form an element separation region 2 of shallow trench isolation. Necessary impurity ions are implanted into an active region 3 defined by the element isolation region 2 to form desired wells. A tunnel oxide film 4 of about 10 nm in thickness is formed on the surface of the active region, for example, by thermal oxidation.

As shown in FIGS. 4XB and 4YB, covering the tunnel oxide film 4, a polysilicon film doped with P is grown to a thickness of 90 nm by CVD, and patterned in a striped shape along the bit line. Covering the patterned polysilicon film 6, a silicon oxide film of about 5 nm in thickness and a silicon nitride film of about 10 nm in thickness are deposited, and the surface of the silicon nitride film is thermally oxidized to form an ONO film 7. Thereafter, the ONO film in the peripheral circuit area is removed, and a gate oxide film for peripheral circuit transistors is grown.

As shown in FIGS. 4XC and 4YC, a polysilicon film of about 180 nm in thickness is grown on the ONO film 7 by CVD and patterned along the word line, and the ONO film 7 and polysilicon film 6 are patterned at the same time. In this manner, the word line structure is formed. By using the gate structure formed in this manner as a mask, As ions are implanted into the silicon substrate 1 at an acceleration energy of 30 keV and a dose of $1\times10^{15}$ cm$^{-2}$ to form diffusion regions 9. Ions are implanted into the control gate 8 at the same time. In this case, the polysilicon film in the peripheral circuit area is not patterned but it is left on the whole surface.

As shown in FIGS. 4XD and 4YD, covering the gate structures, a silicon nitride film is grown to a thickness of about 100 nm by CVD, and reactive ion etching (IRE) is performed over the whole surface to leave sidewall spacers 10. The tunnel oxide film 4 is patterned at the same time.

After the side wall spacers 10 are formed, the gate electrode pattern is formed in the peripheral circuit area, and LDD ion implantation is performed separately for NMOS and PMOS. Thereafter, side wall spacers of silicon oxide are formed.

Ions are implanted into n-channel regions and p-channel regions at a high concentration to form high concentration source/drain regions in the peripheral circuit area and high concentration diffusion regions in the memory area. At the same time, impurities are doped into the gate electrode, and into the control gate in the memory area.

After high concentration impurity doping, a Co film having a thickness of about 8 nm is formed by sputtering, and annealing is performed to perform a silicidation reaction and selectively form cobalt silicide films 11 on the source/drain regions, diffusion regions and gate electrodes. In the subsequent drawings, the silicide film 11 is omitted.

As shown in FIGS. 4XE and 4YE, a silicon nitride film 13 is grown on the substrate surface to a thickness of bout 20 nm by CVD, and a silicon oxide film 14 is grown to a thickness of about 1.5 µm by high density plasma (HDP) CVD and planarized by CMP. A resist mask is formed on the silicon oxide film 14, and contact holes and first source line trenches are formed by etching.

For example, by using a photoresist pattern as a mask, the silicon oxide layer 14 is etched and this etching is once stopped at the silicon nitride layer 13. Thereafter, the silicon nitride layer is etched to expose the diffusion regions 9.

After the resist mask is removed, a Ti film and a TiN film are formed in this order by sputtering, and then a W layer is grown by CVD and buried in the contact holes and trenches. Metal layers deposited on the surface of the silicon oxide film 14 are removed by CMP to bury the W layer 15 only in the contact holes and trenches. In this manner, column-like plugs and wall-like plugs are formed.

As shown in FIGS. 4XF and 4YF, a silicon oxide film 16 is grown on the silicon oxide film 14 to a thickness of about 500 nm by CVD. Grown on the silicon oxide film 16 are a silicon nitride film 17 of about 20 nm in thickness, a silicon oxide film 18 of about 300 nm in thickness and a silicon nitride film 19 of about 20 nm in thickness.

The silicon oxide film is a film providing the function of an interlayer insulating film. Instead of the silicon oxide film, a fluoride silicate glass (FSG) film or a low dielectric constant insulating film such as an organic insulating film may be used. The silicon nitride film is a film having a function of an etching stopper, and other films such as an SiC film may be used in place of the silicon nitride film.

A photoresist pattern PR1 is formed on the silicon nitride film 19, having openings in areas corresponding to areas where thick wirings are formed. By using the photoresist pattern PR1 as a mask, the silicon nitride film 19, silicon oxide film 18 and silicon nitride film 17 are etched. The silicon oxide film 18 is preferably etched by etching having a slow etching rate relative to the silicon nitride film 17. The silicon nitride film 17 is preferably etched by etching having a slow etching rate relative to the silicon oxide film 16. In etching each layer, the underlying layer functions as an etch stopper. The photoresist pattern PR1 is thereafter removed.

As shown in FIGS. 4XG and 4YG, a photoresist pattern PR2 is formed on the silicon nitride film 19, having openings in areas corresponding to areas where thin wirings are formed. By using the photoresist pattern PR2 as a mask, the silicon nitride film 19 is etched. The silicon nitride film is preferably etched by etching having a low etching rate relative to the silicon oxide film 18. After the silicon nitride film 19 is patterned, the photoresist pattern PR2 is removed.

In this state, the regions where the silicon nitride film 19 is left are the regions where the full thickness of the second interlayer insulating film is left, the regions where the silicon nitride film 19 is removed and the silicon oxide film 18 is left are the regions where thin wirings are formed, and the regions where also the silicon nitride film 17 is removed are the regions where thick wirings are formed.

As shown in FIGS. 4XH and 4YH, by using the silicon nitride films 17 and 19 as etching stoppers, the silicon oxide films 18 and 16 are etched to form wiring trenches and via holes. The surfaces of the tungsten plugs are exposed in deep wiring trenches and via holes. In the regions where thin wirings are formed, the silicon nitride film 17 functions as an etching stopper and protects the underlying insulating film. Therefore, the thin wiring and underlying conductive plug are not electrically shorted.

Although the etching depth is controlled by using an etching stopper, the etching depth may be controlled by control etching or the like to omit the etching stoppers.

As shown in FIGS. 4XI and 4YI, on the second interlayer insulating film formed with wiring holes and trenches, a TaN barrier layer and a Cu seed layer are formed by sputtering, and a Cu layer is formed by electroplating. Next, metal layers on the silicon nitride layer 19 are removed by CMP to leave wirings only in the wiring trenches and holes to form bit lines BL and a second source line SL2.

As shown in FIGS. 4XJ and 4YJ, covering the second source line SL2 and bit lines BL, a third interlayer insulating film 21 is formed on the silicon nitride layer 19, and wiring trenches are formed by using a photoresist pattern. Middle layer wirings 22 are buried in the wiring trenches. An upper level interlayer insulating film 23 is deposited and wiring trenches and holes are formed. A metal layer is buried in the wiring trenches and holes to form upper wirings 24.

If necessary, middle wirings and upper wirings are formed repetitively to increase the number of wiring layers. A passivation layer 25 is formed on the last wiring layer. For example, the second layer wirings may be used as liner wirings for lowering the resistance of the word lines, and the third layer wirings may be used as signal wirings.

The first layer bit line may be used as a subsidiary bit line, and the third layer wiring may be used as a main bit line. In this case, it is desired to form a thin wiring and a thick wiring as the third layer wiring. It is desired that the bit line has a small parasitic capacitance and is made of a thin wiring. It is desired that the wiring in the peripheral circuit area is made thick to have a low resistance.

In this embodiment, the wiring layer structure of the thin wiring can be considered as a dual damascene wiring. A wiring trench and connection hole corresponding to the wiring trench and via hole of the dual damascene structure are formed and a conductive film is buried in the wiring trench and connection hole. The thick wiring can also be considered as a wiring of the damascene structure. A deep wiring trench is formed through the full thickness of the interlayer insulating film and a thick wiring is buried.

A wiring of the dual damascene structure is formed by depositing a barrier layer and a wiring layer in this order in the whole recess portion including the wiring trench and via hole. In the case of a plug or a single damascene wiring whose via conductor and wiring are formed separately, the conductive layer in the via hole is made of a lamination of the barrier layer and wiring layer, and the wiring layer in the wiring trench is also made of a lamination of the barrier layer and wiring layer. In the context of this meaning, the above-described wiring layer can be considered as the wiring layer of the dual damascene structure. The manufacture method of the semiconductor device of the first embodiment is not limited to that described above.

Figure 5X:
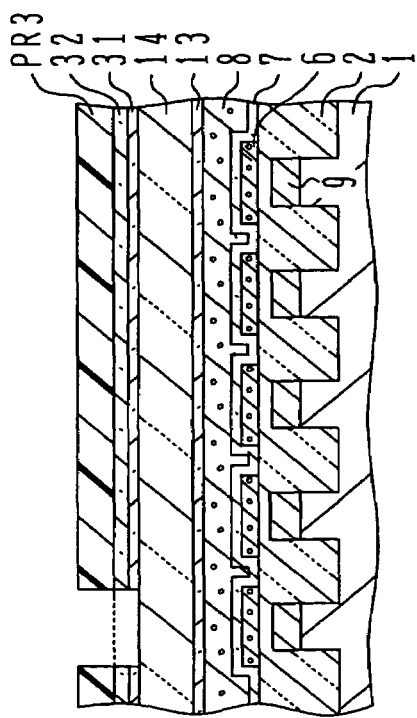
FIGS. 5XA to 5XD and FIGS. 5YA to 5YD are cross sectional views illustrating another manufacture method for the semiconductor device according to the first embodiment of the present invention.
Figure 5Y:
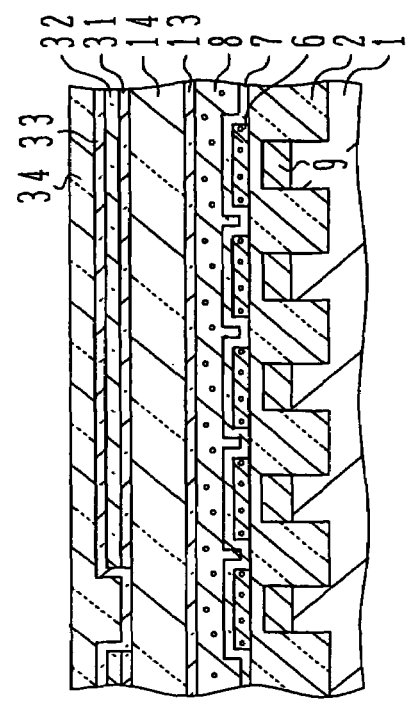
Figure 5Y:
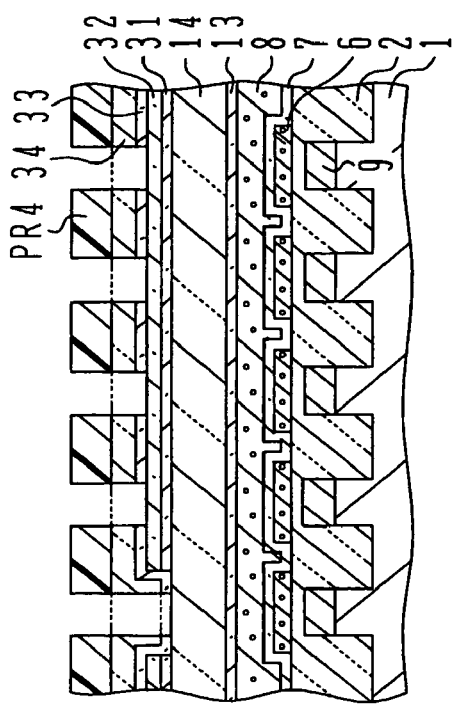
Figure 5Y:
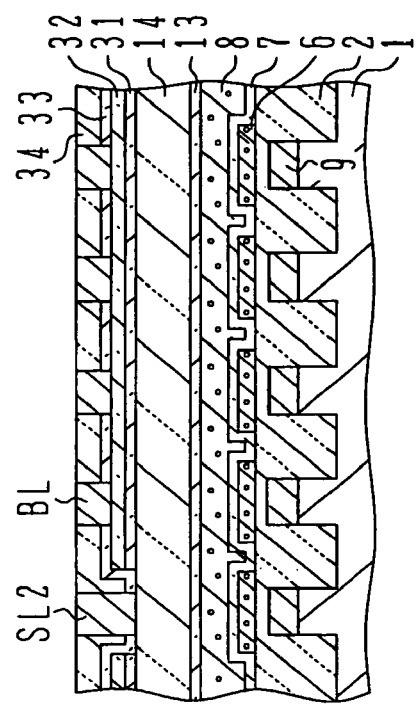
Figure 5X:
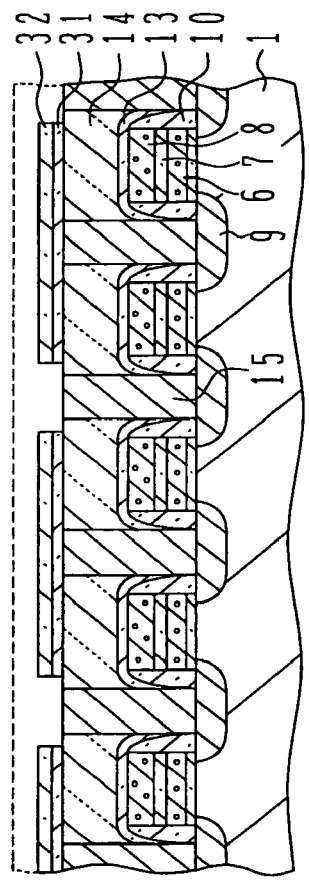
Figure 5X:
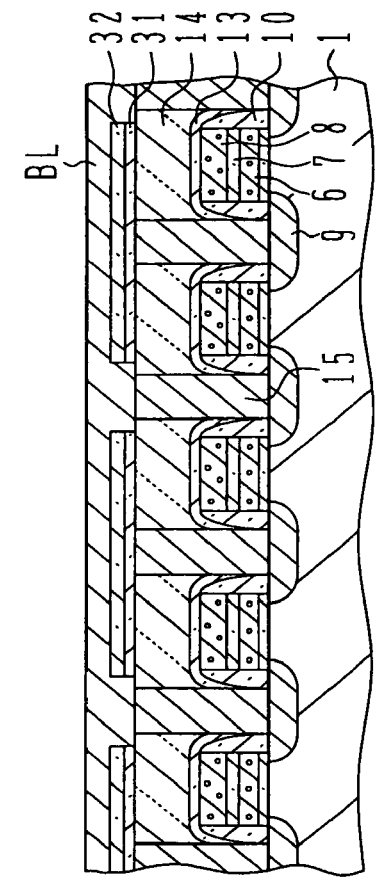

FIGS. 5XA to 5XD and FIGS. 5YA to 5YD illustrate another manufacture method for the semiconductor device of the first embodiment. The processes up to those shown in FIGS. 4XA to 4XE and FIGS. 4YA to 4YE are executed in the manner similar to that of the above-described embodiment.

As shown in FIGS. 5XA and 5YA, a silicon nitride layer 31 of about 20 nm thick and a silicon oxide film 32 of about 50 nm thick are grown on the first interlayer insulating film 14 by CVD, covering the conductive plugs 15. A photoresist pattern PR3 is formed having openings in areas corresponding to areas where thick wirings are formed on the silicon oxide film 32.

By using the photoresist pattern PR3 as a mask, the silicon oxide layer 32 and silicon nitride layer 31 are etched. It is preferable that etching the silicon oxide film 32 is stopped once at the silicon nitride film 31, and thereafter the silicon nitride layer 31 is selectively etched to prevent the underlying silicon oxide layer 14 from being etched. The photoresist pattern PR3 is thereafter removed.

As shown in FIGS. 5XB and 5YB, a silicon nitride film 33 of about 20 nm thick and a silicon oxide layer 34 of about 300 nm thick are grown covering the patterned silicon oxide layer 32. The surface thereof is planarized by CMP.

As shown in FIGS. 5XC and 5YC, a photoresist pattern PR4 is formed which does not cover the area where wirings are not formed, and the silicon oxide layer 34 is etched until the silicon nitride film 33 is exposed. The silicon oxide layer 34 is etched under the condition that an etching rate of the silicon nitride film is very slow. Next, the silicon nitride film 33 is etched.

The underlying silicon oxide layer 32 and silicon nitride layer 31 are already removed in the area where thick wirings are formed. Therefore, as the silicon oxide layer 34 and silicon nitride layer 33 are removed, the full thickness of the second interlayer insulating film is removed and the conductive plugs 15 are exposed. In the area where thin wirings are formed, the silicon oxide layer 32 and silicon nitride film 31 are left to electrically insulate wirings to be formed above and the underlying conductive plugs. The photoresist pattern PR4 is thereafter removed.

As shown in FIGS. 5XD and 5YD, for example, a barrier layer of TaN and a seed layer of Cu are formed by sputtering, a Cu layer is formed by electroplating, and an unnecessary portion is removed by CPM to form wirings BL and SL2. The bit line BL is formed thick in the area where it is connected to the underlying conductive plug, and thin in the other area. The second source line SL2 is a thick wiring having a thickness substantially equal to the full thickness of the second interlayer insulating film along a direction crossing the first source line SL1.

Figure 6A:
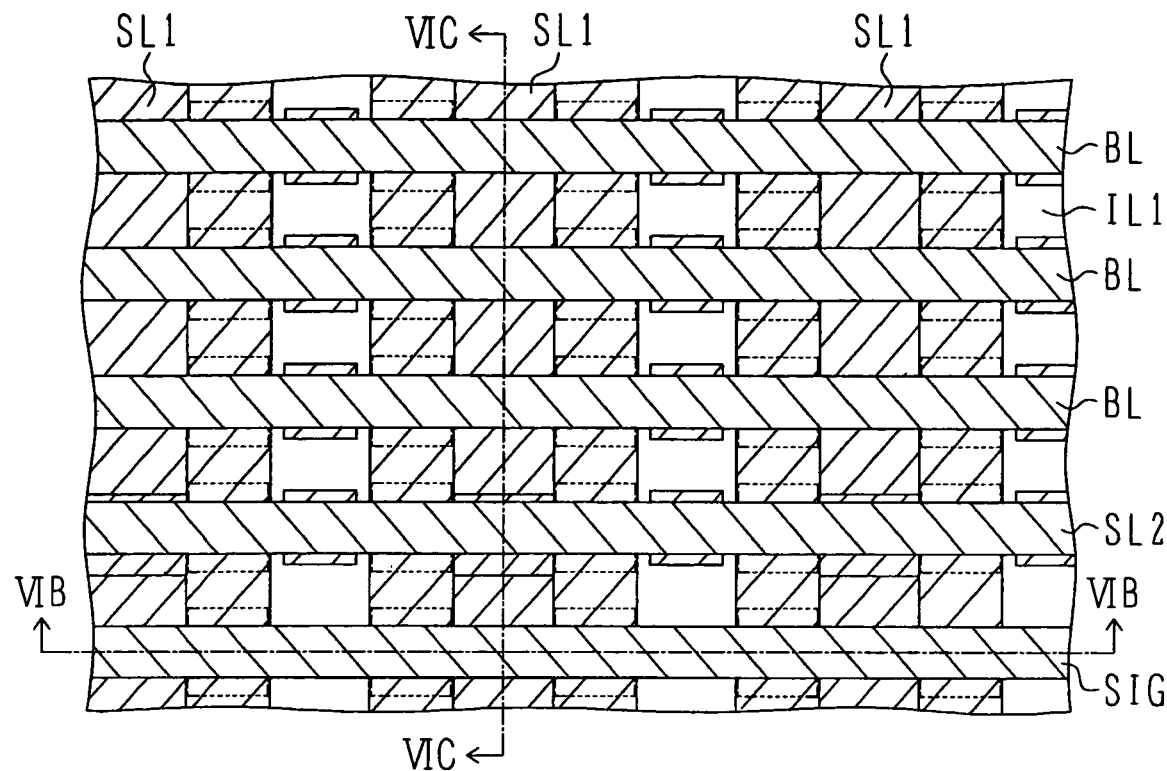
FIGS. 6A, 6B and 6C are a plan view and cross sectional views according to a modification of the first embodiment of the present invention.
Figure 6B:
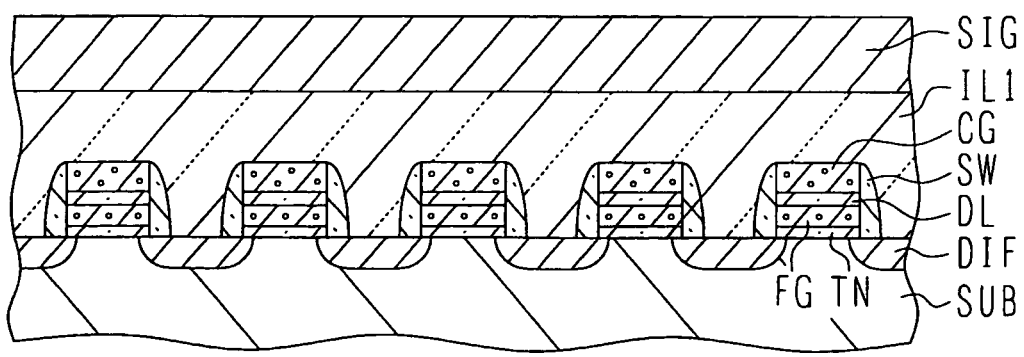
Figure 6C:
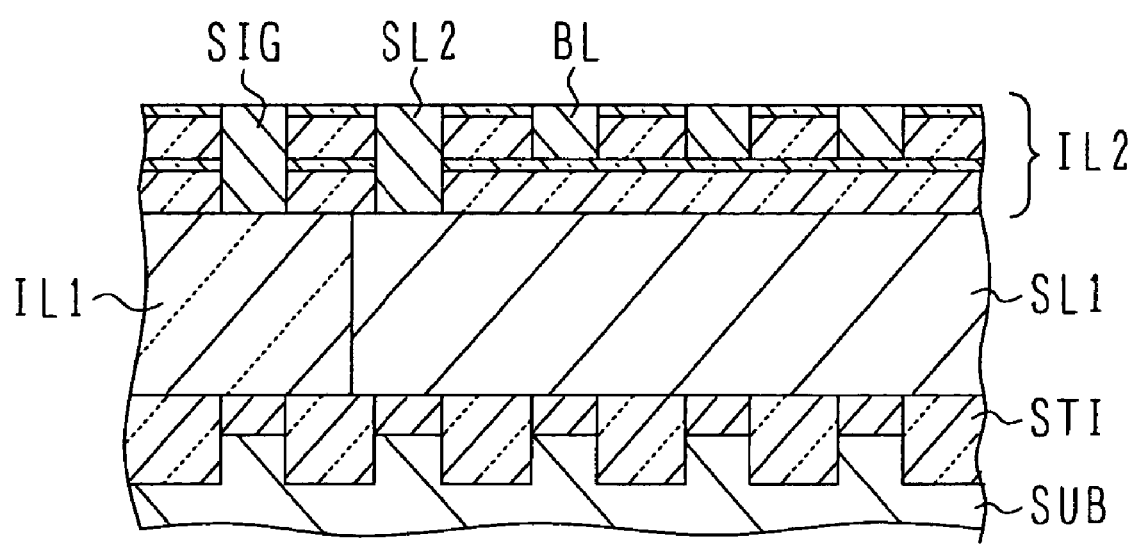

The substantially equal thickness means a functionally same thickness including the case wherein a thickness changes due to dishing, erosion and the like. FIGS. 6A, 6B and 6C are a plan view and cross sectional views of a modification of the first embodiment. FIG. 6A is a plan view, and FIGS. 6B and 6C are cross sectional views taken along lines VIB-VIB and VIC-VIC of FIG. 6A.

As shown in FIG. 6A, in addition to a plurality of bit lines BL and a second source line SL2, a signal wiring SIG is added in parallel to the lines BL and SL2.

As shown in FIGS. 6B and 6C, conductive plugs are not formed under the signal wiring SIG. Although gate structures are formed, the structures have no lead electrodes and are dummy structures. The signal wiring SIG is made of a thick wiring having a thickness substantially equal to that of the second interlayer insulating film IL2.

Figure 7A:
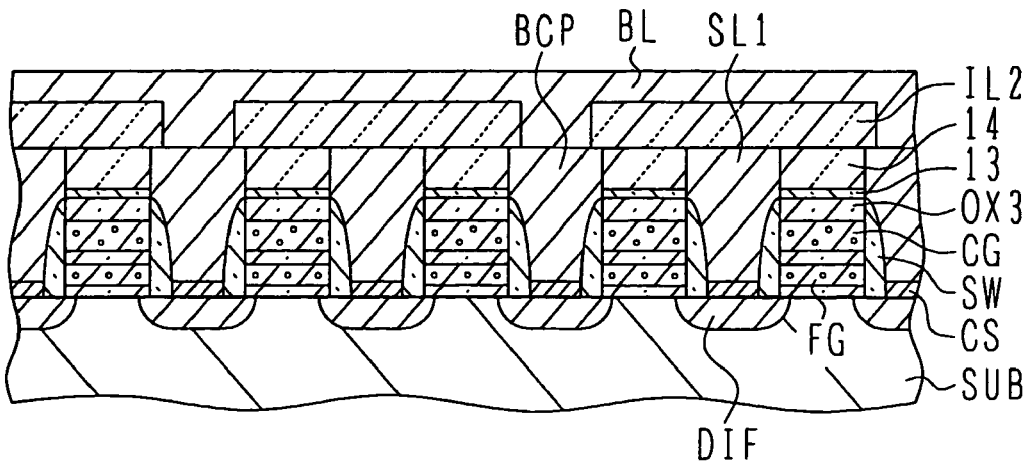
FIGS. 7A, 7B and 7C are cross sectional views of a semiconductor device according to a second embodiment of the present invention.
Figure 7B:
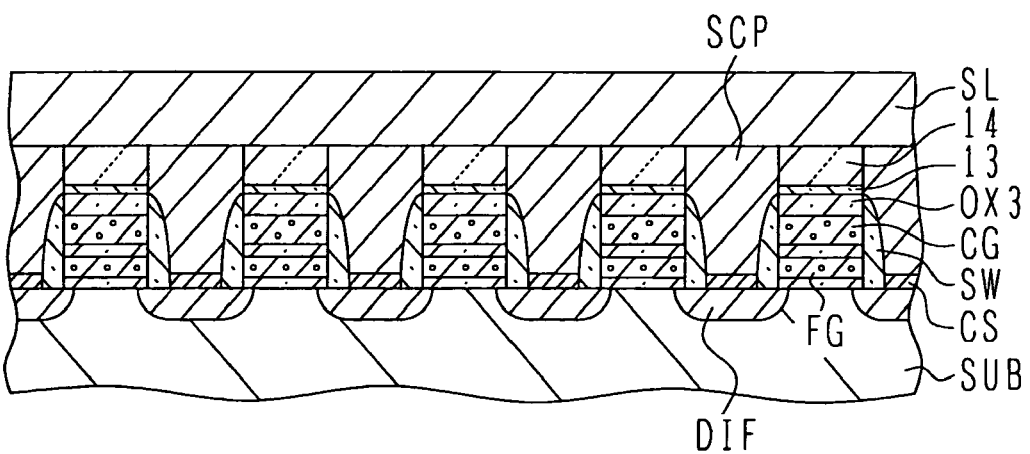
Figure 7C:
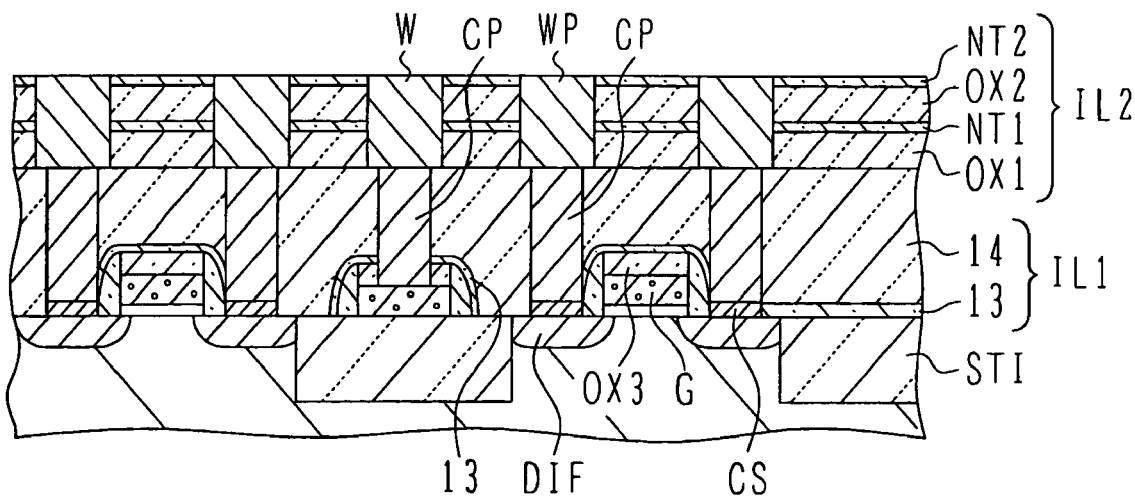

FIGS. 7A, 7B and 7C are schematic cross sectional views showing the structure of a semiconductor device according to the second embodiment. The plan layout is similar to the plan layout (FIG. 3A) of the first embodiment.

FIGS. 7A and 7B are cross sectional views taken along lines IIIB-IIIB and IIIC-IIIC of FIG. 3A. In a gate electrode structure, a silicon oxide layer OX3 is formed on a control gate CG. After side wall spacers SW are formed on the side walls of the gate electrode structure, a first interlayer insulating film is formed including a silicon nitride layer 13 and a silicon oxide layer 14. A bit contact plug BCP and a first source line SL1 are formed in self-alignment with the gate structure. Assuming that the width of the conductive plug is constant, the memory cell area can be reduced and the integration degree can be improved, by forming the conductive plug and gate electrode structure near to each other or in an overlapped manner.

By using a photoresist mask, the silicon oxide layer 14 in the area where the plug is formed is etched, and etching is stopped at the silicon nitride layer 13. The exposed silicon nitride layer 13 is etched to expose the diffusion region. Even if the wiring trench and wiring hole overlap the gate electrode when the silicon nitride layer is etched, the silicon oxide layer OX3 and side wall spacer SW prevent an electric short circuit.

FIG. 7C is a cross sectional view showing the structure in the peripheral logic circuit area. Also in the peripheral logic circuit area, the silicon oxide layer OX3 is formed on the gate electrode G to form the gate electrode structure. A silicon nitride layer 13 and a silicon oxide layer 14 are stacked on the gate electrode structures to constitute a first interlayer insulating film IL1. Self alignment contact (SAC) is not adopted in the peripheral logic circuit area. According to this modification, bit wirings having a low capacitance and source lines having a low resistance can be integrated at a high density.

FIGS. 8A to 8D are schematic cross sectional views illustrating main processes for manufacturing the structure shown in FIGS. 7A, 7B and 7C. These cross sectional views are taken along a bit line direction.

First, floating gate structures of a flash memory are formed by executing the processes shown in FIGS. 4XA and 4XB and FIGS. 4YA and 4YB.

Figure 8A:
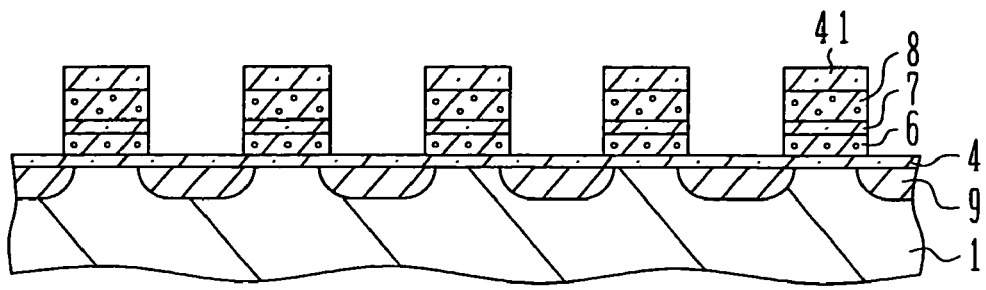
FIGS. 8A to 8D are cross sectional views illustrating main processes for manufacturing the semiconductor device according to the second embodiment of the present invention.

As shown in FIG. 8A, after a floating gate layer 6 is patterned, a dielectric layer 7, a polysilicon layer 8 and a silicon oxide layer 41 are stacked. For example, the silicon oxide layer 41 is 200 nm thick. The lamination structure is patterned to form striped shapes along the word line direction. Instead of the silicon oxide layer 41, other insulating layers may be formed such as a silicon nitride layer.

Figure 8B:
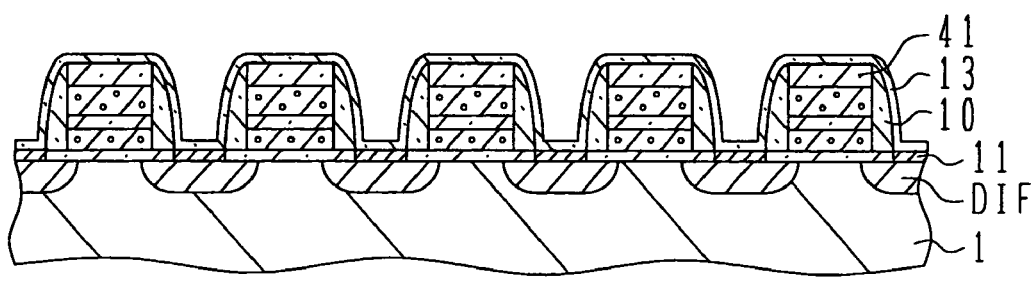

As shown in FIG. 8B, after side wall spacers 10 are formed, diffusion regions DIF are formed. Gate electrodes are formed also in the peripheral logic circuit area. A Co layer is formed by sputtering to form silicide layers 11. The silicide layer 11 is formed on the diffusion regions DIF and source/drain regions in the peripheral circuit area. A silicon nitride layer 13 is formed thereafter to a thickness of about 20 nm by CVD.

Figure 8C:
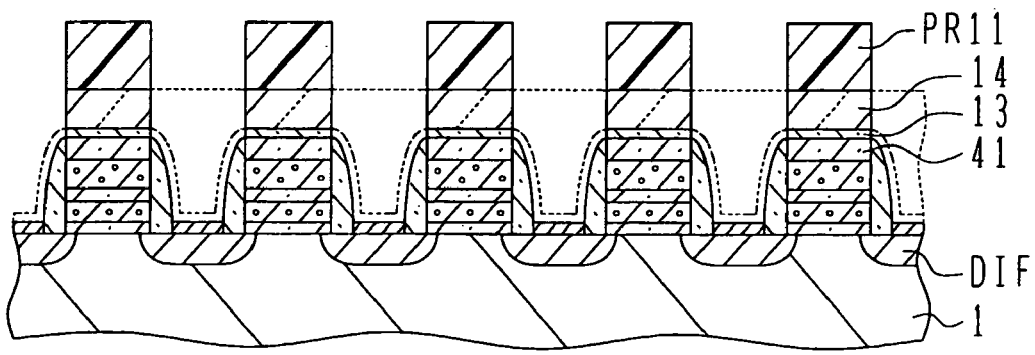

As shown in FIG. 8C, a silicon oxide layer 14 is deposited to a thickness of about 1.5 μm on the silicon nitride layer 13 by HDP-CVD and the surface thereof is planarized by CMP. A photoresist pattern PR11 is formed on the surface of the silicon oxide layer 14 to form contact holes and trenches for first source lines by etching.

In this etching, etching the silicon oxide layer is stopped once on the surface of the silicon nitride film 13. Next, the silicon nitride film 13 is etched to expose the surface of the diffusion region DIF. The silicon oxide layer 41 is left covering the upper surface of the control gate 8. The photoresist pattern PR11 is thereafter removed.

Figure 8D:
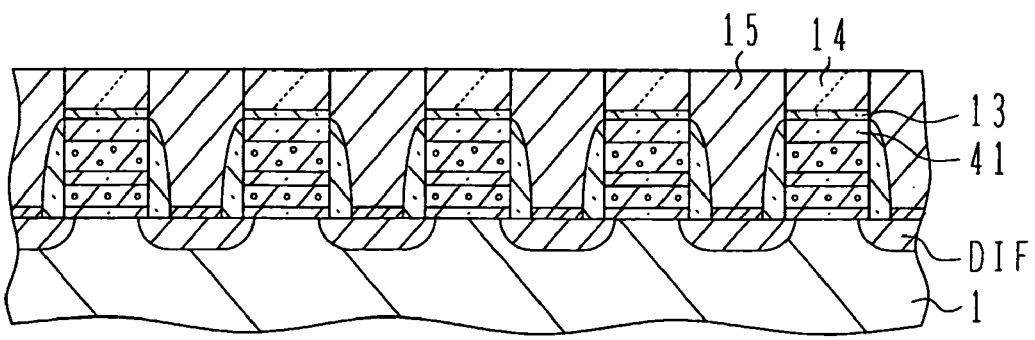

As shown in FIG. 8D, a Ti film and a TiN film are formed on the substrate surface by sputtering to form the barrier layer, and thereafter, a W layer is grown by CVD. Unnecessary metal layers on the surface of the silicon oxide layer 14 are removed to leave the W wiring layer 15 only in the contact hole and trench. Thereafter, processes similar to those shown in FIGS. 4XF to 4XJ and FIGS. 4YF to 4YJ are executed to complete a semiconductor device.

Figure 9A:
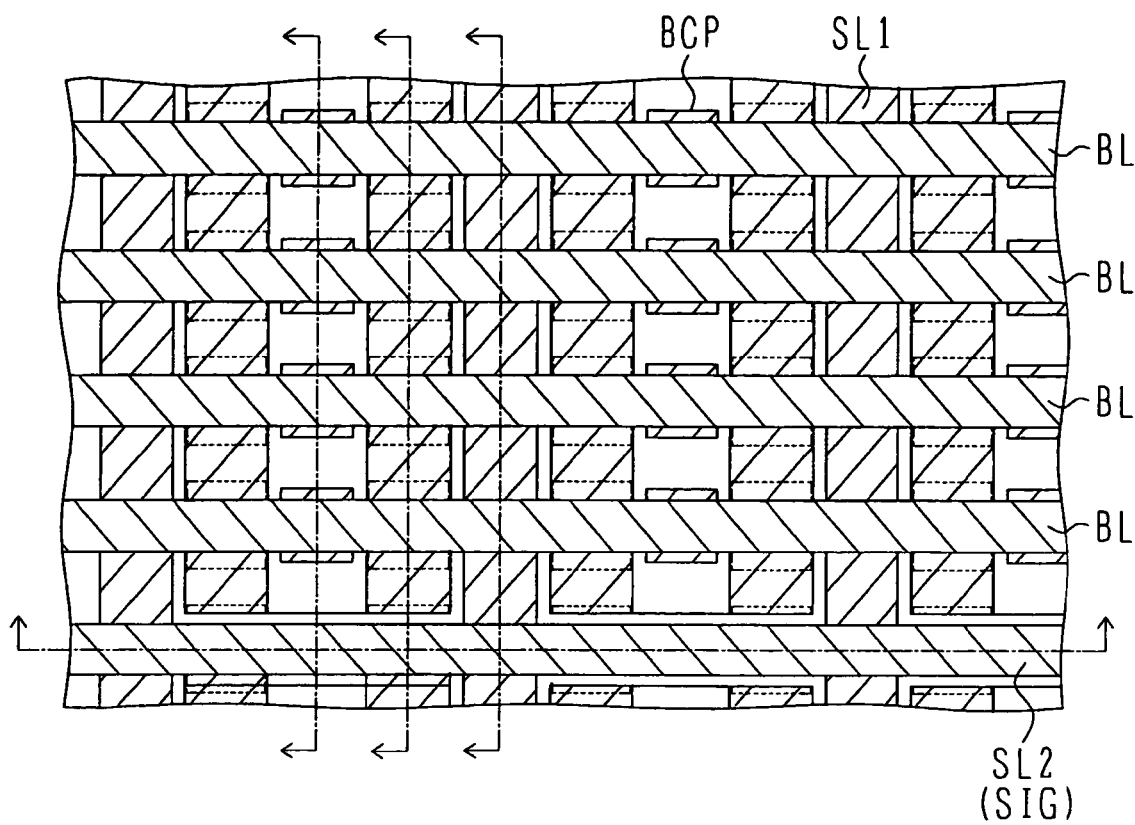
FIGS. 9A, 9B and 9C are a plan view and cross sectional views of a semiconductor device according to a third embodiment of the present invention.
Figure 9B:
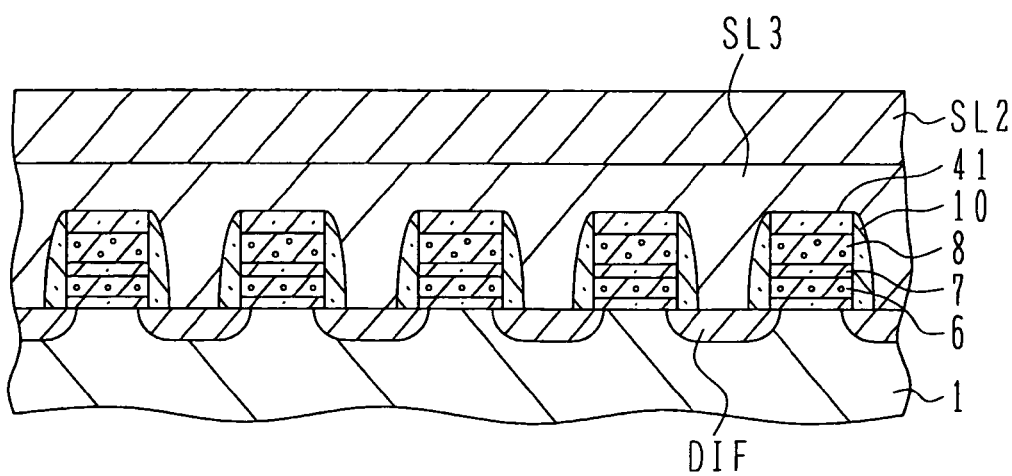
Figure 9C:
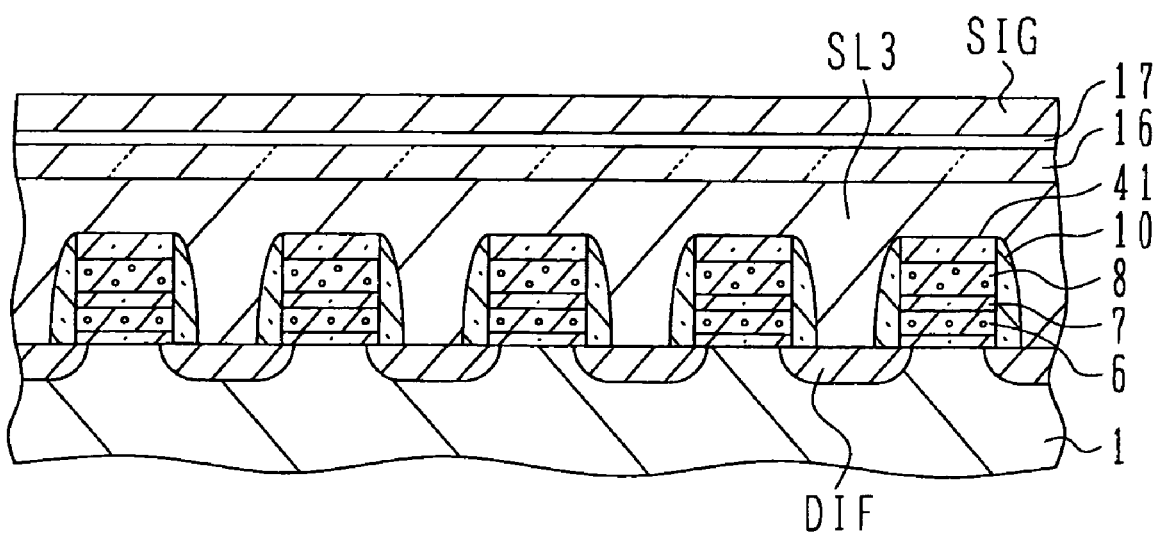

FIGS. 9A, 9B and 9C are a plan view and cross sectional views showing the structure of a semiconductor device according to the third embodiment of the present invention. In the first embodiment, the second source line is made of the thick wiring formed through the second insulating film and connects in common a plurality of first source lines. In the third embodiment, a third source line formed through a first interlayer insulating film and in parallel to a bit line connects in common a plurality of bit lines. In an upper area, a thick second source line or other wirings may be formed.

As shown in FIG. 9A, similar to the embodiments described above, bit lines BL and first source lines SL1 are formed. The third source line crossing the first source lines is formed in the first interlayer insulating film at the lowermost row as viewed in the drawing. Above the third source line, a second source line SL2 or a signal line SIG is formed.

FIG. 9B illustrates the case wherein the second source line is formed. A silicon oxide layer 41 is formed on a control gate electrode layer 8 of polysilicon, and side wall spacers 10 are formed on the side walls of the gate electrode to constitute a gate electrode structure. Similar to the second embodiment, a first interlayer insulating film IL1 is formed covering the gate electrode structures.

At the same time when the first source lines and bit contact plugs are formed, the third source line SL3 crossing the gate electrode structures is formed covering the gate electrode structure. The third source line SL3 electrically connects the plurality of first source lines.

On the third source line SL3, the second source line SL2 similar to that of the above-described embodiments is formed. The second and third source lines SL2 and SL3 in unison connect the plurality of first source lines SL1 at a low resistance to provide a ground source line having a low resistance as a whole.

In the area where the second source line SL2 is formed, even if the gate electrode structure is formed above the active region, this structure of the memory cell is a dummy structure. In other words, the region under the second source line is not useful. If the third source line is formed in this region, the ground source line resistance can be lowered further.

FIG. 9C shows the structure that a signal line SIG is formed in parallel to the bit line. The third source line is formed in a manner similar to that shown in FIG. 9B. Similar to the above-described embodiments, it is assumed that the second interlayer insulating film is a lamination of a silicon oxide layer 16, a silicon nitride film 17, a silicon oxide layer 18 and a silicon nitride film 19. In forming a wiring layer, the second silicon nitride film 19 and second silicon oxide layer 18 are patterned and a conductor is buried to form a shallow signal layer SIG. The signal layer SIG is electrically separated from the third source line SL1 by the involved silicon oxide layer 16 and silicon nitride layer 17.

In the above-described embodiments, a NOR type flash memory cells are used illustratively. Similar structures may be applied to NAND type flash memory cells.

Figure 10A:
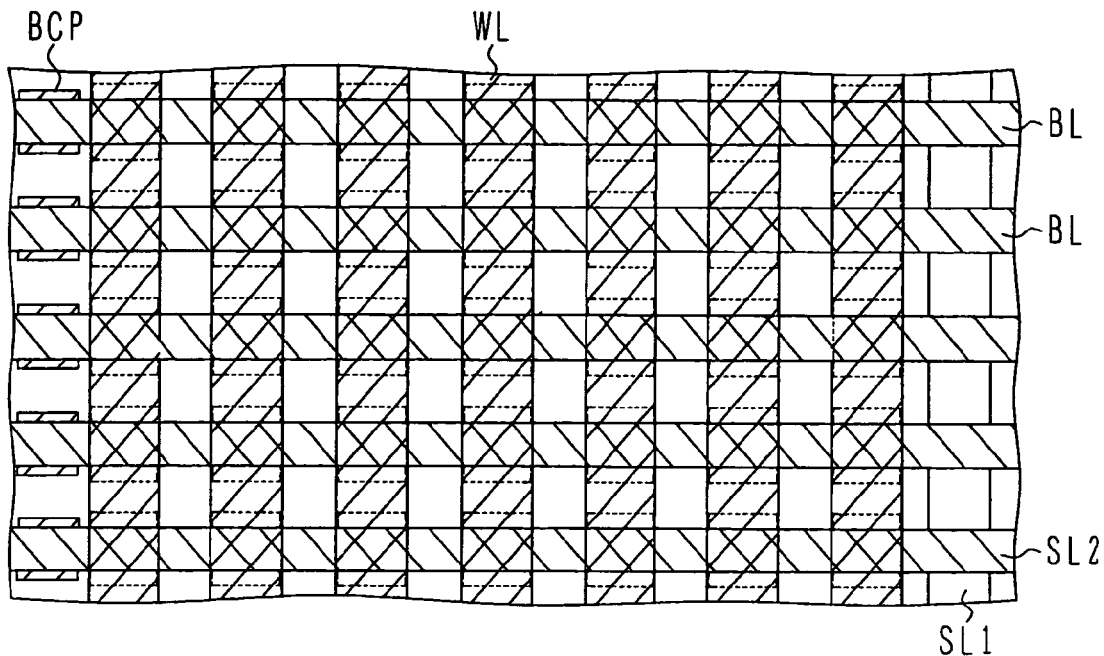
FIGS. 10A, 10B and 10C are a plan view and cross sectional views of a semiconductor device according to a fourth embodiment of the present invention.
Figure 10B:
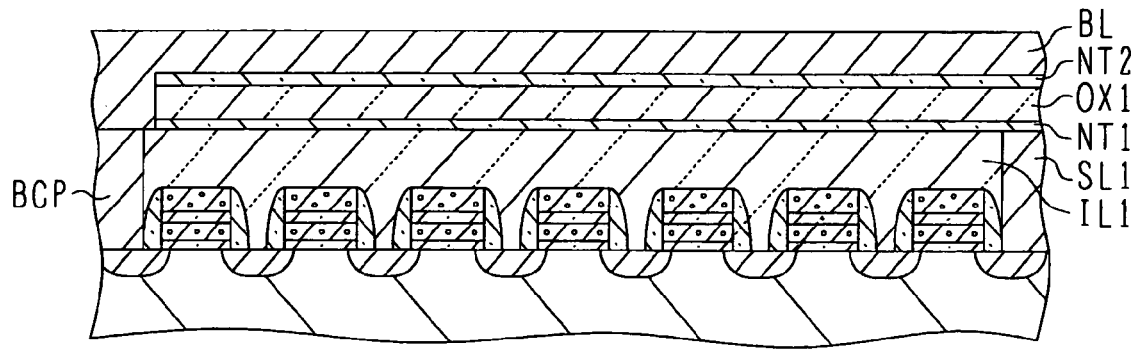
Figure 10C:
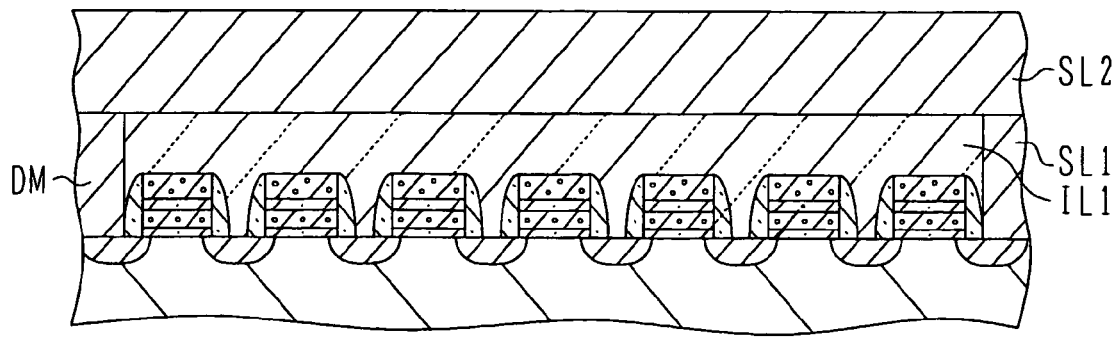
Figure 11A:
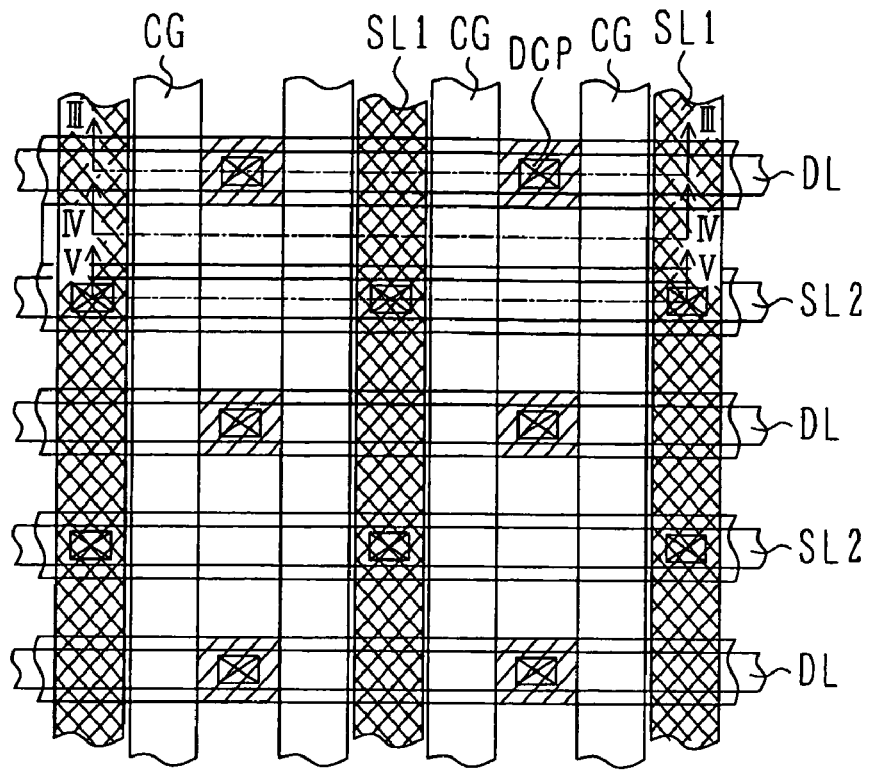
FIGS. 11A to 11D are a plan view and cross sectional views showing an example of prior art.
Figure 11B:
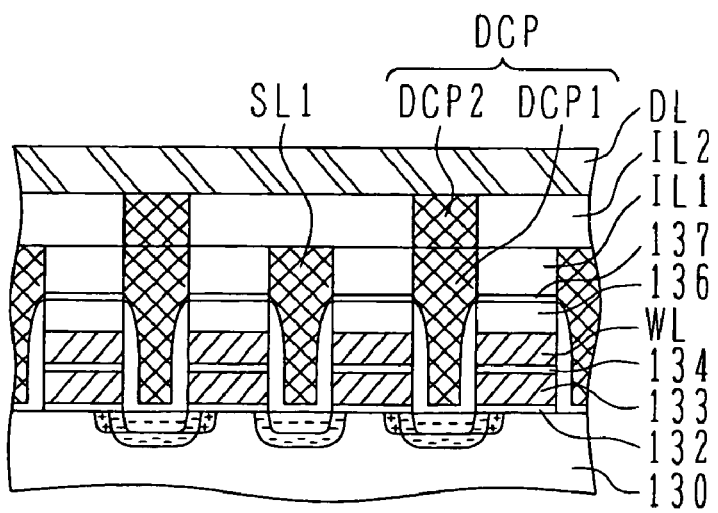
Figure 11C:
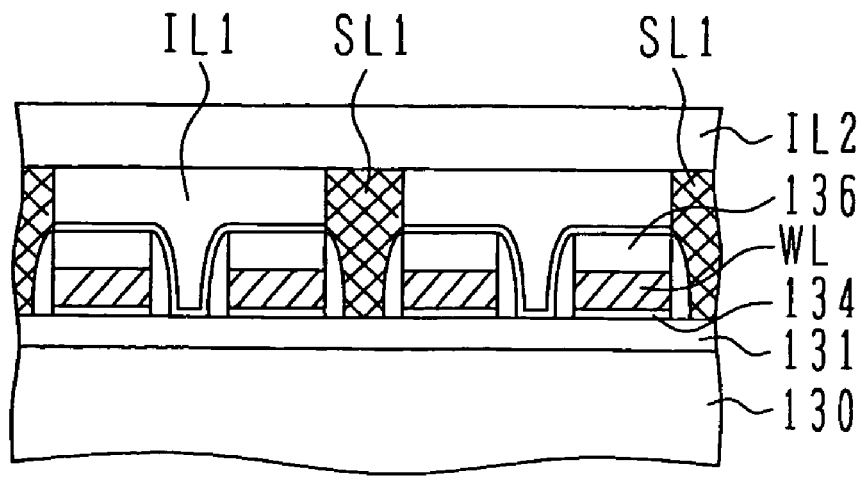
Figure 11D:
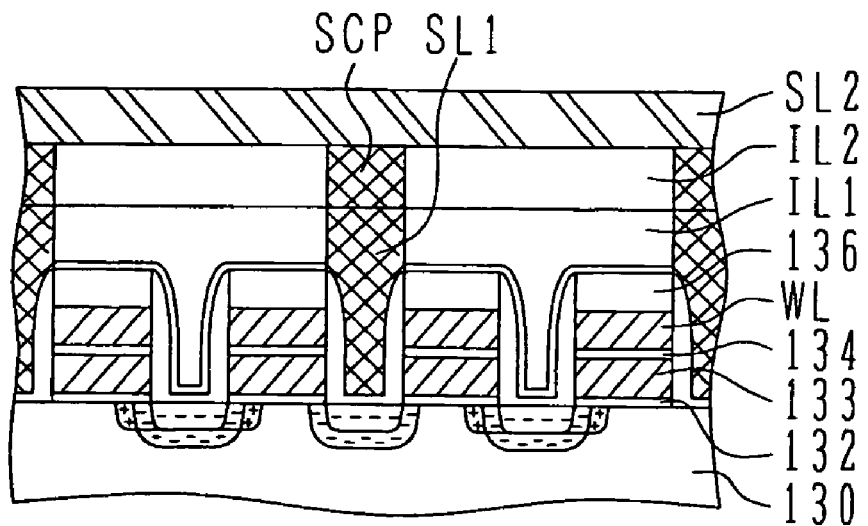

FIGS. 10A, 10B and 10C illustrate an embodiment of NAND type flash memory cells.

As shown in FIG. 10A, a first source line SL1 and a bit contact plug BCP are formed at opposite ends of an active region in which a plurality of flash memory cells are connected in series. In the intermediate region, conductive plugs are not formed.

FIG. 10B is a cross sectional view taken along a bit line direction. A plurality of NAND type flash memory cells are connected in series. Connected to opposite ends of this serial circuit are the first source line SL1 and bit contact plug BCP. The bit contact plug BCP is independent for each active region and is connected to a corresponding bit line BL. The first source line SL1 is common to a plurality of active regions and is connected to a second source line formed through a second interlayer insulating film at the lower most row.

As shown in FIG. 10C, in the area along the second source line, the thick second source line SL2 is electrically connected to the first source line SL1. The transistor structures under the second source line SL2 are dummy transistors. The contact plug formed in this area by a process similar to that for the bit contact plug BCP is a dummy DM. The dummy plug and dummy transistors may not be formed by using mask processed.

The present invention has been described by taking as an example flash memory cells. The present invention is not limited thereto. Materials and numerical data in the embodiments can be modified in various ways. A circuit to be formed is not limited to a flash memory. In a variety of circuits, lower layer wirings can be formed by using column-like conductive plugs and wall-like conductive plugs, an interlayer insulating film is formed covering the lower layer wirings, wirings having different thicknesses can be formed in the interlayer insulating film, and thin wiring layers can be crossed with lower layer wall-like wirings. A thin wiring can be connected to the lower layer plug at a desired position. A plurality of conductive plugs can be connected to a thick wiring.

In an area where low capacitance wirings are required, thin wirings are formed to lower capacitance, whereas in an area where low resistance wirings are required, thick wirings are formed to lower resistance.

It will be apparent to those skilled in the art that other various modifications, improvements, combinations, and the like can be made.

The present invention is applicable to a semiconductor device having multi-layer crossed wirings, particularly to a semiconductor device having a flash memory circuit.

I claim:

1. A semiconductor device comprising:
   a semiconductor substrate structure having a plurality of semiconductor elements formed therein;
   a first insulating layer formed above said semiconductor substrate structure;
   a plurality of column-like conductive plugs having column-like shape and formed through a full thickness of said first insulating layer;
   a plurality of elongated wall-like conductive plugs having wall-like shape and formed through the full thickness of said first insulating layer;
   a second insulating layer formed on said first insulating layer, covering said column-like conductive plugs and wall-like conductive plugs;
   a plurality of first wirings including a first portion formed through a full thickness of said second insulating layer and connected to at least one of said column-like conductive plugs and a second portion formed in said second insulating layer to an intermediate depth and crossing at least one of said wall-like conductive plugs in separated state; and
   a second wiring formed through the full thickness of said second insulating layer, in a manner extending in uniform thickness over all regions between adjacent ones of said plurality of wall-like conductive plugs and over said plurality of wall-like conductive plugs, and being connected to and crossing said plurality of wall-like conductive plugs.

2. The semiconductor device according to claim 1, further comprising a third wiring of the damascene structure formed through the full thickness of said second insulating layer in an area where said wall-like conductive plugs are not formed.

3. The semiconductor device according to claim 1, wherein said semiconductor substrate structure includes a flash memory unit which comprises:
   a semiconductor substrate;
   a plurality of striped active regions disposed in rows in said semiconductor substrate;
   a plurality of word lines formed above said semiconductor substrate and disposed crossing said active regions;
   a plurality of floating gates each disposed in crossing areas between said active regions and said word lines and at intermediate position between said active regions and said word lines; and
   a plurality of diffusion regions formed in said active regions between said word lines.

4. The semiconductor device according to claim 3, wherein said first insulating layer is disposed covering said word lines and said wall-like conductive plugs include a plurality of first source lines formed through the full thickness of said first insulating layer in every second areas between said word lines, connected to associated ones of said diffusion regions and extending along a direction crossing said active regions.

5. The semiconductor device according to claim 4, wherein said column-like conductive plugs include a plurality of drain contact plugs formed on diffusion regions other than said diffusion regions connected to said first source lines, and said first wirings include a plurality of bit lines having said first portion connected to associated ones of said drain contact plugs and said second portion crossing said first source lines in separated state.

6. The semiconductor device according to claim 5, further comprising a second source line formed through the full thickness of said second insulating layer and connected to said first source lines.

7. The semiconductor device according to claim 6, wherein said second insulating layer includes a plurality of insulating layers having different etching characteristics, and said second portion of said bit line is formed through only part of the insulating layers.

8. The semiconductor device according to claim 5, wherein said flash memory unit further includes third insulating layers formed on said word lines, and side wall spacers formed on side walls of said floating gates, said word lines, and said third insulating layer, said first insulating layer includes a plurality of insulating layers having different etching characteristics, and said first source lines and said drain contact plugs are self-aligned with said word lines.

9. The semiconductor device according to claim 8, further comprising a third source line formed through the full thickness of said first insulating layer and connected to said first source lines.

10. The semiconductor device according to claim 9, further comprising a third wiring formed in said second insulating layer to an intermediate depth and disposed above said third source line in separated state.

11. The semiconductor device according to claim 9, further comprising a second source line formed through the full thickness of said second insulating layer above said third source line and connected to said first source lines and said third source line.

12. The semiconductor device according to claim 5, wherein said semiconductor substrate structure further comprises a peripheral circuit unit which comprises:
   said semiconductor substrate;
   a plurality of active regions disposed in said semiconductor substrate;
   an insulated gate electrode formed on each of said active regions; and
   source/drain regions formed in each of said active regions on both sides of said insulated gate electrode,
   wherein said column-like conductive plugs include source/drain contact plugs reaching said source/drain regions through said first insulating layer, and said peripheral circuit unit further comprises a fourth wiring of a damascene structure formed through the full thickness of said second insulating layer and connected to at least one of said source/drain contact plugs.

* * * * *

UNITED STATES PATENT AND TRADEMARK OFFICE
CERTIFICATE OF CORRECTION

PATENT NO.         : 7,696,555 B2
APPLICATION NO.    : 11/302198
DATED              : April 13, 2010
INVENTOR(S)        : Taiji Ema It is certified that error appears in the above-identified patent and that said Letters Patent is hereby corrected as shown below:

Title Page, insert the following:

--(63) Related U.S. Application Data: Continuation of application No. PCT/JP2003/011125, filed on August 29, 2003.--.

Signed and Sealed this
Eighth Day of March, 2011

David J. Kappos
*Director of the United States Patent and Trademark Office*